(12) United States Patent
Blečić et al.

(10) Patent No.: US 12,051,657 B2
(45) Date of Patent: Jul. 30, 2024

(54) TRANSFORMER DESIGN WITH BALANCED INTERWINDING CAPACITANCE FOR IMPROVED EMI PERFORMANCE

(71) Applicant: Texas Instruments Incorporated, Dallas, TX (US)

(72) Inventors: Raul Blečić, Freising (DE); Nicola Bertoni, Freising (DE); Zhemin Zhang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 500 days.

(21) Appl. No.: 17/474,103

(22) Filed: Sep. 14, 2021

(65) Prior Publication Data

US 2022/0415829 A1 Dec. 29, 2022

Related U.S. Application Data

(60) Provisional application No. 63/215,232, filed on Jun. 25, 2021.

(51) Int. Cl.
| | |
|---|---|
| *H01L 23/64* | (2006.01) |
| *H01F 27/36* | (2006.01) |
| *H01L 21/48* | (2006.01) |
| *H01L 23/498* | (2006.01) |
| *H01L 23/552* | (2006.01) |
| *H01L 49/02* | (2006.01) |
| *H01F 19/00* | (2006.01) |

(52) U.S. Cl.
CPC ......... *H01L 23/645* (2013.01); *H01F 27/363* (2020.08); *H01L 21/4857* (2013.01); *H01L 23/49822* (2013.01); *H01L 23/552* (2013.01); *H01L 28/10* (2013.01); *H01F 19/00* (2013.01)

(58) Field of Classification Search
CPC ..................................... H01L 23/64
See application file for complete search history.

(56) References Cited

PUBLICATIONS

UCC12040 High-Density, Low-EMI, 3-KVRMS Basic Isolation DC/DC Module, product data sheet SNVSBO5B, Texas Instruments, Inc., Dec. 2019, revised May 2021.

*Primary Examiner* — Marvin Payen
(74) *Attorney, Agent, or Firm* — Ronald O. Neerings; Frank D. Cimino

(57) ABSTRACT

An electronic device includes a multilevel lamination structure having a core layer, dielectric layers and conductive features formed in metal layers on or between respective ones or pairs of the dielectric layers. The core layer and the dielectric layers extend in respective planes of orthogonal first and second directions and are stacked along an orthogonal third direction. The conductive features include a first patterned conductive feature having multiple conductive turns in each of a first pair of the metal layers to form a first winding having a first turn and a final turn adjacent to one another in the same metal layer of the first pair, and a second patterned conductive feature having multiple conductive turns in a second pair of the metal layers to form a second winding having a first turn and a final turn.

20 Claims, 15 Drawing Sheets

TRANSFORMER DESIGN WITH BALANCED INTERWINDING CAPACITANCE FOR IMPROVED EMI PERFORMANCE

CROSS-REFERENCE TO RELATED APPLICATION

This application claims priority to and benefit of U.S. Provisional Patent Application Ser. No. 63/215,232, filed on Jun. 25, 2021, and titled "TRANSFORMER DESIGN WITH BALANCED INTERWINDING CAPACITANCE FOR IMPROVED EMI PERFORMANCE", the contents of which are hereby fully incorporated by reference.

BACKGROUND

Electronic devices can be a source of electromagnetic interference (EMI) and many devices are tested to EMI radiated and conducted emissions specifications. One source of EMI is the current injection through the parasitic interwinding capacitance of a transformer. The injected current creates a secondary ground bounce which generates a line disturbance that is potentially coupled into another circuit or that excites power supply wires acting as an emitting antenna. Differential mode voltage of a transformer with non-symmetrical distributed interwinding capacitance contributes to EMI radiation, particularly when operating at high input voltages.

SUMMARY

In one aspect, an electronic device includes a multilevel lamination structure and a package structure. The multilevel lamination structure has a core layer, dielectric layers, and conductive features formed in metal layers on or between respective ones or pairs of the dielectric layers. The core layer and the dielectric layers extend in respective planes of orthogonal first and second directions and are stacked along an orthogonal third direction. The conductive features include first and second patterned conductive features. The first patterned conductive feature has multiple conductive turns in each of a first pair of the metal layers to form a first winding having a first turn and a final turn. The first and final turns of the first winding are spaced apart from one another and adjacent to one another in the same metal layer of the first pair. The second patterned conductive feature has multiple conductive turns in each of a second pair of the metal layers to form a second winding having a first turn and a final turn. The core layer is positioned between the first and second patterned conductive features along the third direction. The semiconductor die is electrically coupled to the multilevel lamination structure, and the package structure encloses the multilevel lamination structure and the semiconductor die.

In another aspect, a magnetic assembly includes a core layer, dielectric layers, and conductive features formed in metal layers on or between respective ones or pairs of the dielectric layers. The core layer and the dielectric layers extend in respective planes of orthogonal first and second directions and are stacked along an orthogonal third direction. The conductive features include first and second patterned conductive features. The first patterned conductive feature has multiple conductive turns in each of a first pair of the metal layers to form a first winding having a first turn and a final turn. The first and final turns of the first winding are spaced apart from one another and adjacent to one another in the same metal layer of the first pair. The second patterned conductive feature has multiple conductive turns in each of a second pair of the metal layers to form a second winding having a first turn and a final turn. The core layer is positioned between the first and second patterned conductive features along the third direction.

In a further aspect, a method for fabricating an electronic device includes fabricating a multilevel lamination structure with first and second windings, coupling a semiconductor die to one of the first and second windings, and enclosing the multilevel lamination structure and the semiconductor die in a package structure. The multilevel lamination structure includes a core layer, dielectric layers, and conductive features formed in metal layers on or between respective ones or pairs of the dielectric layers. The core layer and the dielectric layers extend in respective planes of orthogonal first and second directions and are stacked along an orthogonal third direction. The conductive features include a first patterned conductive feature has multiple conductive turns in each of a first pair of the metal layers to form a first winding having a first turn and a final turn, where the first and final turns of the first winding are spaced apart from one another and adjacent to one another in the same metal layer of the first pair. The second patterned conductive feature has multiple conductive turns in each of a second pair of the metal layers to form a second winding having a first turn and a final turn, and the core layer is positioned between the first and second patterned conductive features along the third direction.

DETAILED DESCRIPTION

Figure 1:
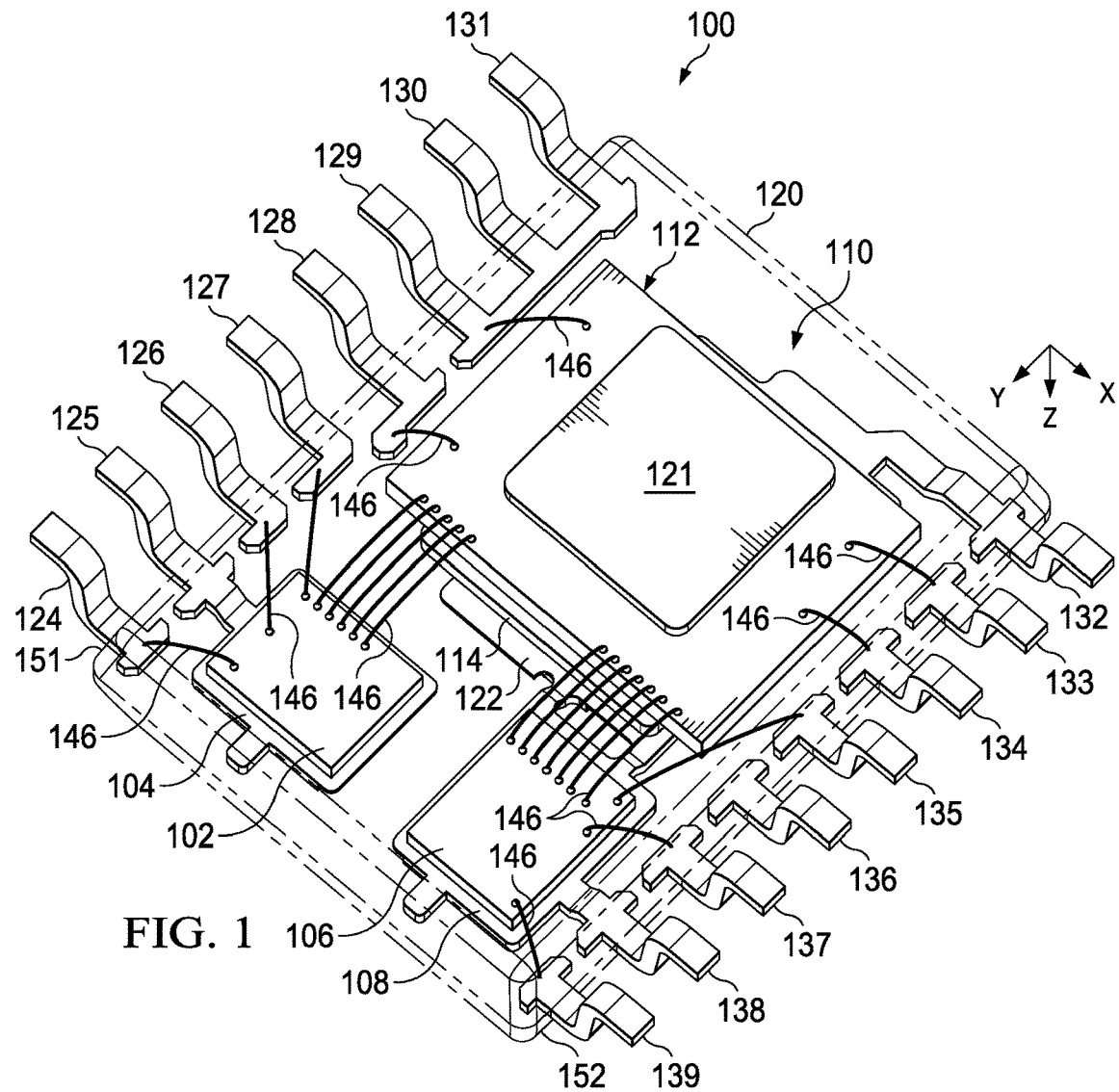
FIG. 1 is a bottom perspective view of a packaged electronic device that includes a magnetic assembly having vertically balanced coil windings with vertically aligned ends and a shield winding.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1B:
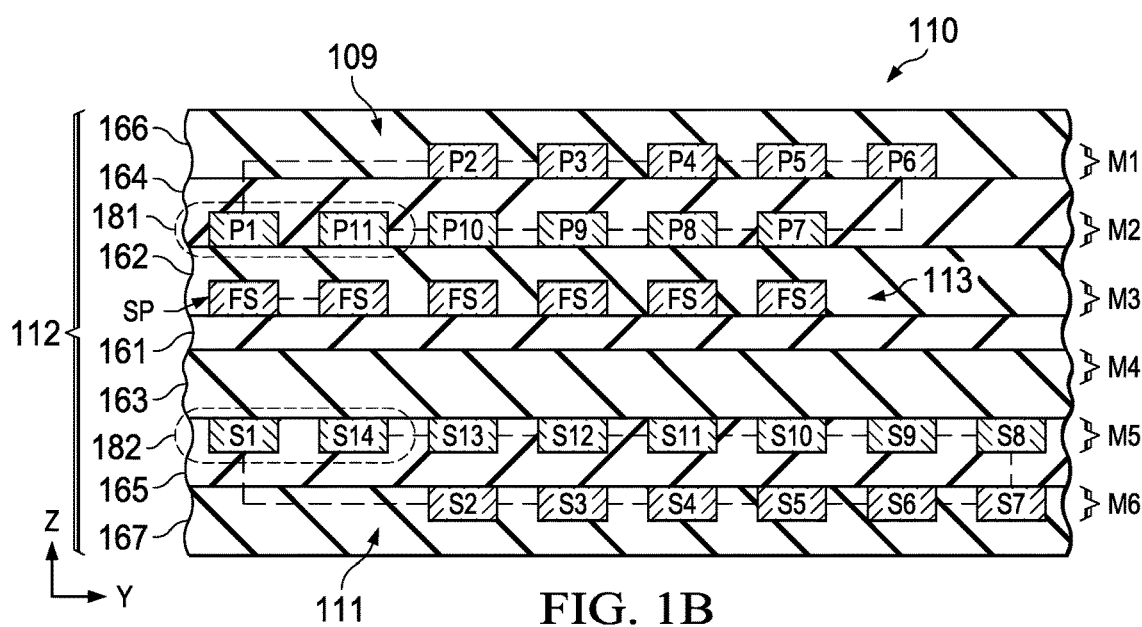
FIG. 1B is a partial sectional end elevation view of the magnetic assembly taken along line 1B-1B of FIG. 1A.
Figure 1A:
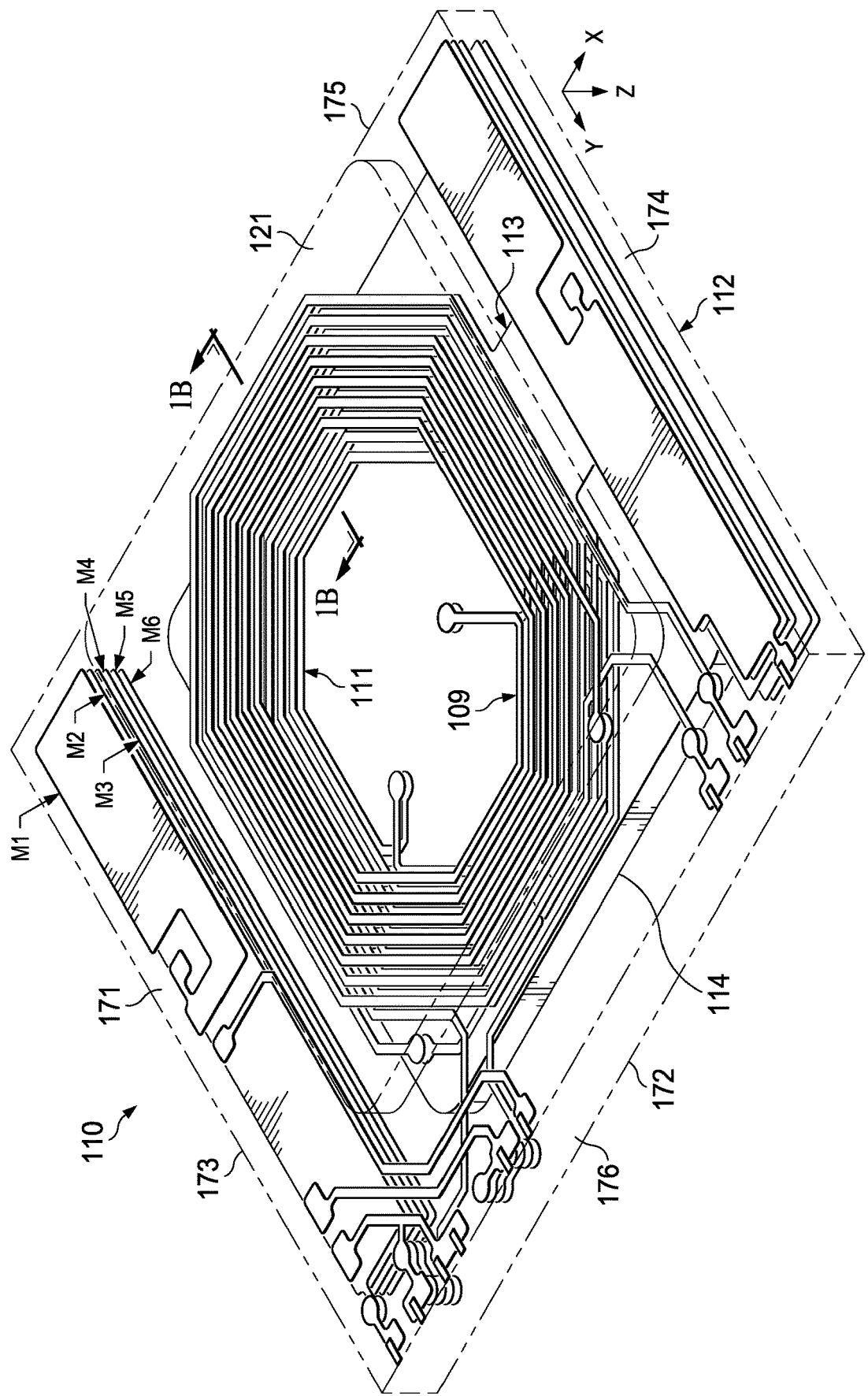
FIG. 1A is a bottom perspective view of the magnetic assembly of FIG. 1.

Referring initially to FIGS. 1-1B, FIG. 1 shows a bottom perspective view of a packaged electronic device 100 with a laminated magnetic assembly 110 having balanced primary and secondary transformer windings to facilitate balanced interwinding capacitance and mitigate secondary ground bounce and generated EMI. The secondary voltage in certain applications moves not only relative to a ground or other reference point but also relative to the primary. The magnetic assembly 110 has vertically balanced coil windings with vertically aligned ends and a shield winding. FIG. 1A shows a bottom perspective view of the magnetic assembly 110 and FIG. 1B shows a sectional side view of the magnetic assembly 110 taken along line 1B-1B of FIG. 1A. The example electronic device 100 has a small outline integrated circuit (SOIC) package type with gull wing leads on opposite first and second sides spaced from one another along a first direction labelled "X" in the drawings. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 100 includes a ball grid array (BGA) package or a land grid array (LGA) type, such as a mold array process ball grid array (MAPBGA) or an over-molded BGA (e.g., plastic BGA or PBGA).

The electronic device 100 provides electrical interconnections for first and second electrical circuits, some or all of which are implemented using bond wires. In other implementations, different forms of interconnection types can be used, including substrate-based interconnections (BGA, LGA, etc.), in which a substrate (not shown) includes electrical interconnections and signal routing structures (e.g., copper or aluminum traces on one or more layers or levels) alone or in combination with bond wire electrical connections. The electronic device 100 includes conductive features (e.g., conductive die attach pads or supports) for mounting and supporting first and second semiconductor dies 102 and 106 and a laminated magnetic assembly 110. The die attach pads and device leads can include any suitable conductive structures, such as copper, aluminum, etc.

As shown in FIG. 1, the electronic device 100 includes a first semiconductor die 102 attached to a first conductive die attach pad 104 of a starting lead frame assembly. The device 100 also includes a second semiconductor die 106 attached to a second conductive die attach pad 108. The electronic device 100 includes a first circuit associated with a first voltage domain (e.g., a high voltage circuit of an integrated power device) as well as a second circuit associated with a second voltage domain (e.g., an isolated lower voltage circuit).

As shown in FIGS. 1A and 1B, a first patterned conductive feature 109 has multiple turns in a magnetic assembly 110 to form a first winding (e.g., a primary winding of an isolation transformer of the first circuit). The second circuit in this example includes a secondary winding formed by a second patterned conductive feature 111 (also referred to as a second winding) of the magnetic assembly 110. The magnetic assembly 110 includes a multilevel lamination structure 112 having the first and second patterned conductive features 109 and 111 and a shield 113. In one example, the multilevel lamination structure 112 is or includes a multilevel package structure. The first and second patterned conductive features 109 and 111 each have multiple turns in multiple layers of the multilevel lamination structure 112 to form respective first and second windings that extend in respective planes of orthogonal first and second directions X and Y in the position illustrated in the figures.

The magnetic assembly 110 also includes one or more core structures 114 and/or 121 (FIGS. 1 and 1A) to facilitate forming a magnetic circuit in combination with the patterned conductive features 109 and 111. The illustrated example includes a first (lower or bottom) magnetic core structure 114. The first magnetic core structure 114 is attached to a first (e.g., bottom) side of the multilevel lamination structure 112. The magnetic assembly 110 also includes a second (upper or top) magnetic core structure 121 attached to a second (e.g., top) side of the multilevel lamination structure 112. In one example, the first magnetic core structure 114 is the same size as the second magnetic core structure 121. In another example, the first magnetic core structure 114 is larger than the second magnetic core structure 121. In another example, the first magnetic core structure 114 is smaller than the second magnetic core structure 121. In one example, one or both magnetic core structures 114 and 121 are prefabricated magnetic cores attached using epoxy paste. In another example, one or both magnetic core structures 114 and 121 are fabricated using a thick layer of magnetic paste or a magnetic sheet.

The packaged electronic device 100 also includes a package structure 120 that encloses the conductive die attach pads 104 and 108, the semiconductor dies 102 and 106, the magnetic assembly 110, and portions of conductive leads of the device 100. In one example, the package structure 120 is or includes a molded material, such as plastic. In another example, the package structure 120 is or includes a ceramic material. The magnetic assembly 110 is attached to a support structure 122 that is integral to the second conductive die attach pad 108. In another implementation, the magnetic assembly 110 is mounted to a support structure (not shown) that is separated and spaced apart from the first and second die attach pads 104 and 108.

As best shown in FIG. 1, the electronic device 100 has conductive gull-wing shaped leads 124-131 along one side 151 of the device 100, as well as conductive gull-wing shaped leads 132-139 along an opposite side 152. The respective first and second sides 151 and 152 spaced apart from one another along the first direction (e.g., the X direction). The first conductive leads 124-131 are located along, and extend outward from, the first side 151 of the package structure 120, and the second conductive leads 132-139 are located along, and extend outward from, the second side 152 of the package structure 120. In other implementations, more or fewer device leads are provided.

The electronic device also includes bond wires 146. A first set of the bond wires 146 interconnect certain of the leads 124-131, the primary winding of the magnetic assembly 110 and the first semiconductor die 102 in the first circuit. A second set of the bond wires 146 interconnect certain of the leads 132-139, the secondary winding of the magnetic assembly 110 and the second semiconductor die 106 in the second circuit. As best shown in FIG. 1, the first conductive die attach pad 104 is directly coupled to a single first lead 125. In other examples, the die attach pad 104 is directly coupled to multiple conductive first leads. In the example device 100, the die attach pad 104 and the lead 125 are a single continuous metal structure, such as copper or aluminum. The second conductive die attach pad 108 is directly coupled to a single lead 138, and the connected support structure 122 is directly connected to a single lead 132. In other examples, the second die attach pad 108 and/or the support structure 122 is/are directly coupled to multiple conductive leads. In the example device 100, the second die attach pad 108, the support structure 122, and the leads 132 and 138 are a single continuous metal structure, such as copper or aluminum. The package structure 120 encloses the die attach pads 104 and 108, the associated support structure 122, and inner portions of the conductive leads 124-139.

Figure 1C:
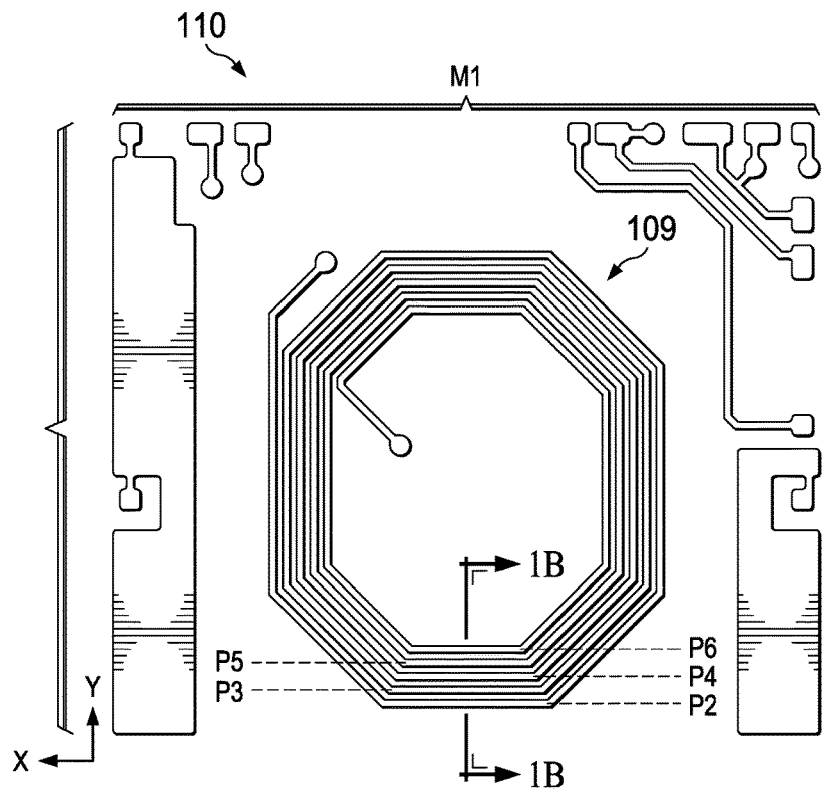
FIG. 1C is top plan view of a first metal layer with upper primary winding turns in the magnetic assembly of FIG. 1.

As shown in the sectional views of FIGS. 1B and 1C, the magnetic assembly 110 includes a multilevel lamination structure 112 having a core layer 161 and dielectric layers 162, 163, 164 and 165, such as laminate layers. The core layer 161 and the dielectric layers 162-165 are or include electrically insulating dielectric material, where the thickness and material of the core layer 161 provides a withstanding voltage according to a desired voltage separation between the first and second circuits for a given design.

The conductive features 111, 109 and 113 are formed in one or more of six metal layers M1, M2, M3, M4, M5 and M6 on or between respective ones or pairs of the dielectric layers 162-165 and/or the core layer 161. The core layer 161 and the dielectric layers 162-165 extend in respective planes of the first and second directions X, Y and are stacked along the third direction Z as best shown in the sectional view of FIGS. 1B and 1C. The core layer 161 in one example provides an electrical isolation barrier between the first or primary circuit and an associated first voltage domain, and a second or secondary circuit operating at an associated second voltage domain. The multilevel lamination structure 112 also has one or more conductive vias providing electrical interconnection for routing signals between two or more of the six metal layers M1-M6.

The section views in FIGS. 1B, 1I, 1J, 3-16 and 19 illustrate only portions of the metal layers M1-M6, and some of these views do not show conductive metal features in each of the metal layers. For example, FIG. 1B does not show any metal structure in the metal layer M4, although that metal layer M4 does include conductive metal features as shown in the top view of FIG. 1F. The example six-layer stack is referred to herein as M1-M6 or M1, M2, M3, M4, M5 and M6 for ease of reference even if a given sectional view does not show metal features in each of the metal layers. As shown in FIGS. 1B and 1C, the multilevel lamination structure 112 has a Z-direction stack of metal levels M1, M2, M3, M4, M5 and M6 formed on or in or between a core layer 161 and dielectric layers 162-165, where the section of FIG. 1B shows conductive metal structures in the metal layers M1, M2, M3, M5, and M6. The first patterned conductive feature 109 includes multiple turns in the metal layer M2 to form the first winding, and the second patterned conductive feature 111 has multiple turns in the metal layer M5, where the first and second windings are on opposite sides of the core layer 161. In one example, the first patterned conductive feature 109 is formed in the second metal layer M2 above the core level 161 and the core layer 161 is positioned between the first and second patterned conductive features 109 and 111 along the third direction Z. In other examples, more or fewer dielectric layers 161-165 can be provided, and more or fewer metal layers can be used.

As further shown in FIG. 1A, the multilevel lamination structure 112 has a first or bottom side 171 and a second or top side 172 spaced apart from one another along the third direction Z, lateral sides 173 and 174 spaced apart from one another along the first direction X, and lateral sides 175 and 176 spaced apart from one another along the second direction Y.

As best shown in FIG. 1B, the multilevel lamination structure 112 has a core layer 161 and dielectric layers 162, 163, 164, 165, 166, and 167. The conductive features 109, 111, and 113 are formed in metal layers M1, M2, M3, M4, M5, and M6 on or between respective ones or pairs of the dielectric layers 162-167. The core layer 161 is or includes a dielectric material. The core layer 161 and the dielectric layers 162-167 extend in respective planes of the orthogonal first and second directions X and Y. The core layer 161 and the dielectric layers 162-167 are stacked along a third direction Z that is orthogonal to the first and second directions X and Y.

As best shown in FIGS. 1A and 1B, the first patterned conductive feature 109 has multiple conductive turns in each of a first pair of the metal layers M1 and M2 that form a first winding (e.g., a primary winding) having primary winding turns P1-P11 including a first turn P1 and a final turn P11 of the primary winding in the same metal layer M2. The first turn P1 and the final turn P11 of the primary winding are spaced apart from one another in the X-Y plane of the second metal layer M2 (e.g., along the second direction Y in the sectional view of FIG. 1B) and are adjacent to one another in the second metal layer M2 as shown at 181 in FIG. 1B. The turns P2-P6 of the first winding in this example are formed in the first metal layer M1, and the turns P1 and P7-P11 are formed in the second metal layer M2.

The second patterned conductive feature 111 has multiple conductive turns S1, S2, S3, S4, S5, S6, S7, S8, S9, S10, S11, S12, S13, and S14 in each of a second pair of the metal layers M5 and M6 to form a second winding (e.g., a transformer secondary winding). The second winding has a first turn S1 and a final turn S14. The secondary winding turns S1 and S8-S14 are formed in the fifth metal layer M5 and the turns S2-S7 are formed in the sixth metal layer M6. The first and final turns S1 and S14 of the second winding are spaced apart from one another and adjacent to one another in the same metal layer M5 as shown at 182 in FIG. 1B.

The core layer 161 is positioned between the respective first and second patterned conductive features 109 and 111 along the third direction Z. The first patterned conductive feature 109 includes winding turns in two adjacent metal layers M1 and M2 and the second patterned conductive feature 111 has multiple conductive turns in two adjacent metal layers M5 and M6 of a six-layer structure in the example of FIGS. 1-1B. In other implementations, one or both of the first and second patterned conductive features have multiple conductive turns in more than two metal layers of a multilayer structure. In these or other implementations, the multilevel lamination structure 112 has a core layer 161 and more than six metal layers and six or more dielectric layers. In these or other implementations, one or both of the first and second patterned conductive features have multiple conductive turns in a respective pair of non-adjacent metal layers.

As further shown in FIG. 1B, the first turn P1 of the first winding is at least partially aligned with the first turn S1 of the second winding along the third direction Z, and the final turn P11 of the first winding is at least partially aligned with the final turn S14 of the second winding along the third direction Z. The first turn P1 of the first winding in the illustrated example is aligned with the first turn S1 of the second winding along the third direction Z and the turns P1 and S1 are of the same or similar widths in their respective X-Y planes, although not a requirement of all possible implementations. In addition, the final turns P11 and S14 in the illustrated example are aligned along the third direction Z and have the same or similar widths in their respective X-Y planes, although not a requirement of all possible implementations. In the illustrated example, the first turn P1 and the final turn P11 of the first winding are formed in the metal layer M2 that is the closest of the first pair to the core layer 161, although not a requirement of all possible implementations. In the illustrated example, moreover, the first turn S1 and the final turn S14 of the second winding are formed in the metal layer M5 that is the closest of the second pair to the core layer 161, although not a requirement of all possible implementations.

The conductive features of the multilevel lamination structure 112 in FIGS. 1-1B also include a patterned shield 113 having multiple conductive turns FS in an inner metal layer (e.g., the third metal layer M3) between the first and second pairs. The shield 113 in this example is coupled to a reference voltage node (e.g., a ground reference) of the primary or first circuit to operate as a primary Faraday shield labeled SP. The shield SP, 113 is positioned between the core layer 161 and the first pair M1, M2 along the third direction Z. In the illustrated example, the turns FS of the shield 113 are of the same or similar widths in the X-Y plane of the third metal layer M3 as the turns P1 and P7-P11 of the first winding, although not a requirement of all possible implementations. In other implementations, the multilevel lamination structure 112 includes a secondary side shield with two or more conductive turns in another inner metal layer between the core layer 161 and the second patterned conductive features of the second winding, alone or in combination with a primary side shield (e.g., FIG. 20 below).

As further shown in FIGS. 1 and 1A, the multilevel lamination structure 112 includes the magnetic core structures 114 and 121 attached to the respective sides 172 and 171 of the multilevel lamination structure 112. In other implementations, one or both of the magnetic core structures 114 and 121 can be omitted.

Figure 1D:
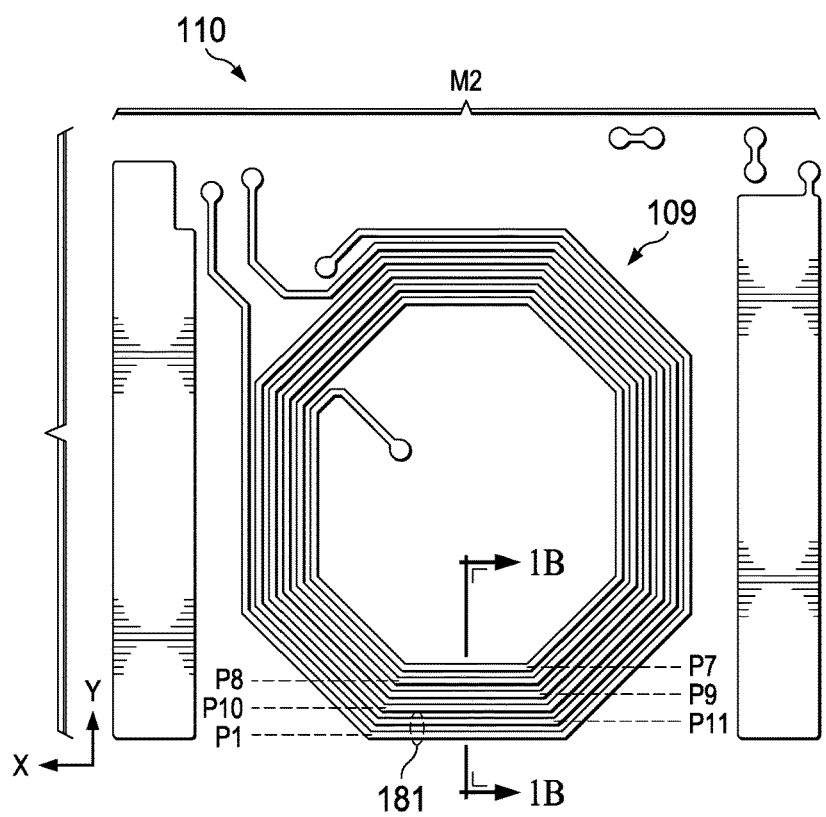
FIG. 1D is top plan view of a second metal layer with lower primary winding turns in the magnetic assembly of FIG. 1.
Figure 1E:
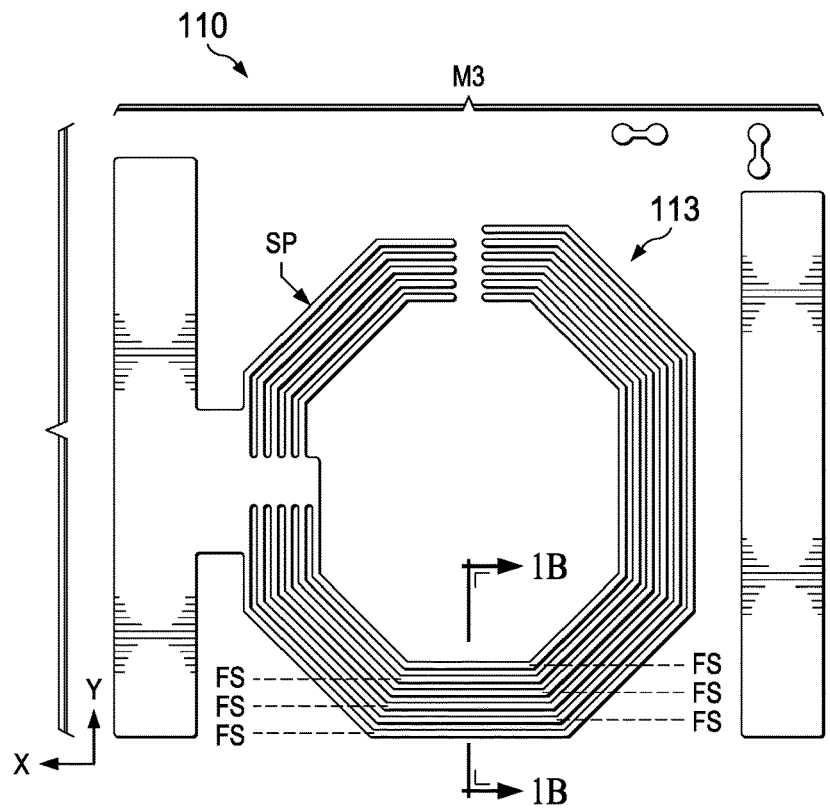
FIG. 1E is top plan view of a third metal layer with primary shield winding turns in the magnetic assembly of FIG. 1.
Figure 1F:
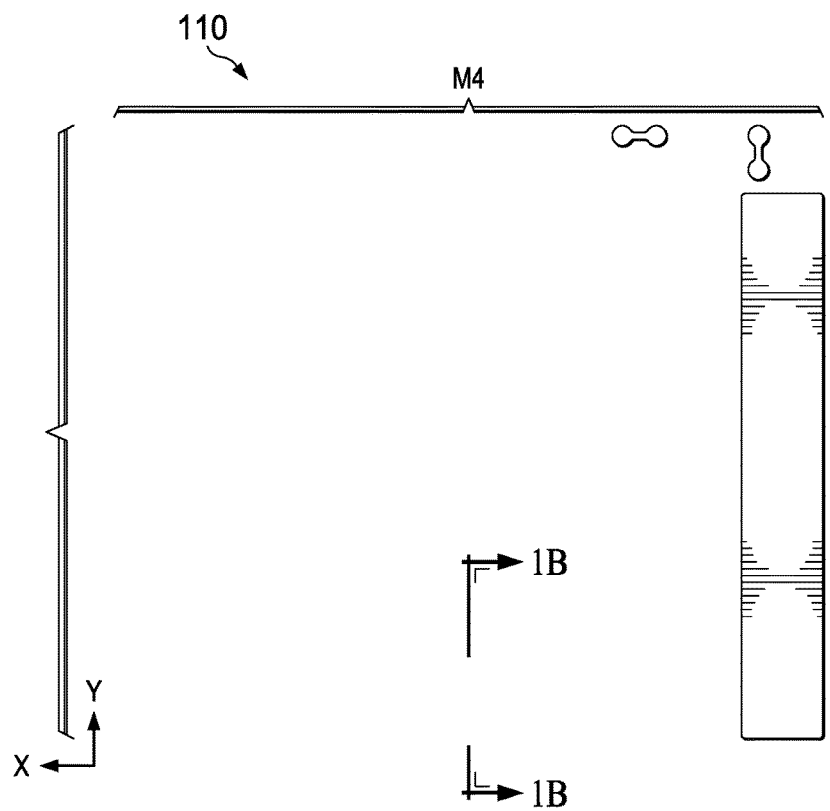
FIG. 1F is top plan view of a fourth metal layer in the magnetic assembly of FIG. 1.
Figure 1G:
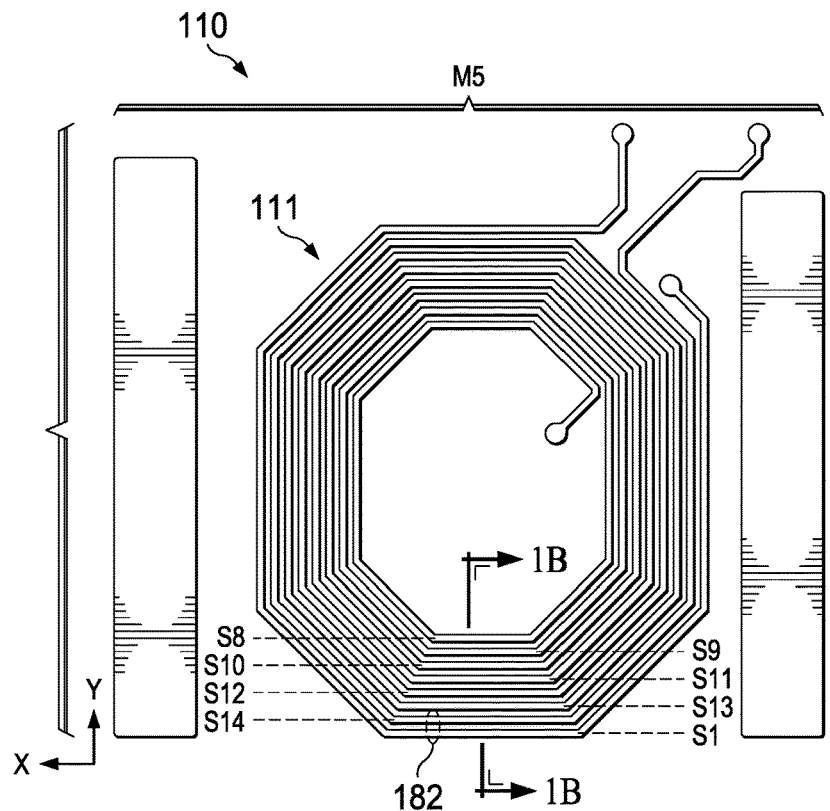
FIG. 1G is top plan view of a fifth metal layer with upper secondary winding turns in the magnetic assembly of FIG. 1.
Figure 1H:
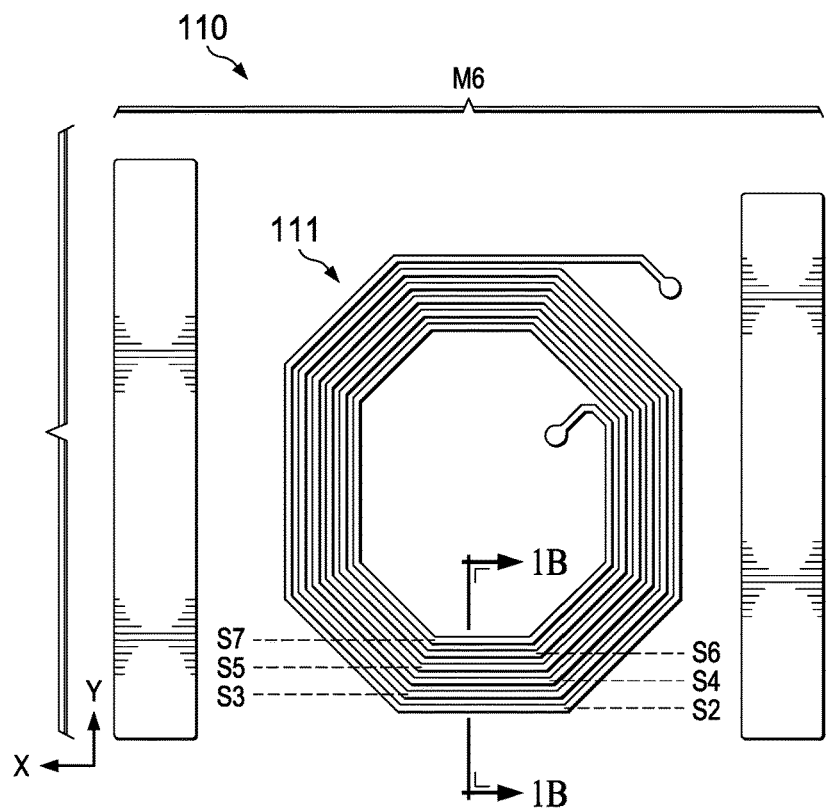
FIG. 1H is top plan view of a sixth metal layer with lower secondary winding turns in the magnetic assembly of FIG. 1.

FIGS. 1C-1H show top views of the respective metal layers M1 in one example implementation of the multilevel lamination structure 112. FIG. 1C shows the first metal layer M1 with the upper primary winding turns P2-P6 and FIG. 1D shows the second metal layer M2 with the lower primary winding turns P1 and P7-P11, including the spaced apart and adjacent first and final primary winding turns P1 and P11 indicated at 181. FIG. 1E shows the third metal layer M3 with the primary shield winding turns FS in the magnetic assembly 110. FIG. 1F shows the fourth metal layer M4 that has no winding turns in this example. FIG. 1G shows the fifth metal layer M5 with the upper secondary winding turns S1 and S8-S14, including the spaced apart and adjacent first and final secondary winding turns S1 and S14 indicated at 182. FIG. 1H shows the sixth metal layer M6 with the lower secondary winding turns S2-S7 in the magnetic assembly 110.

Figure 1I:
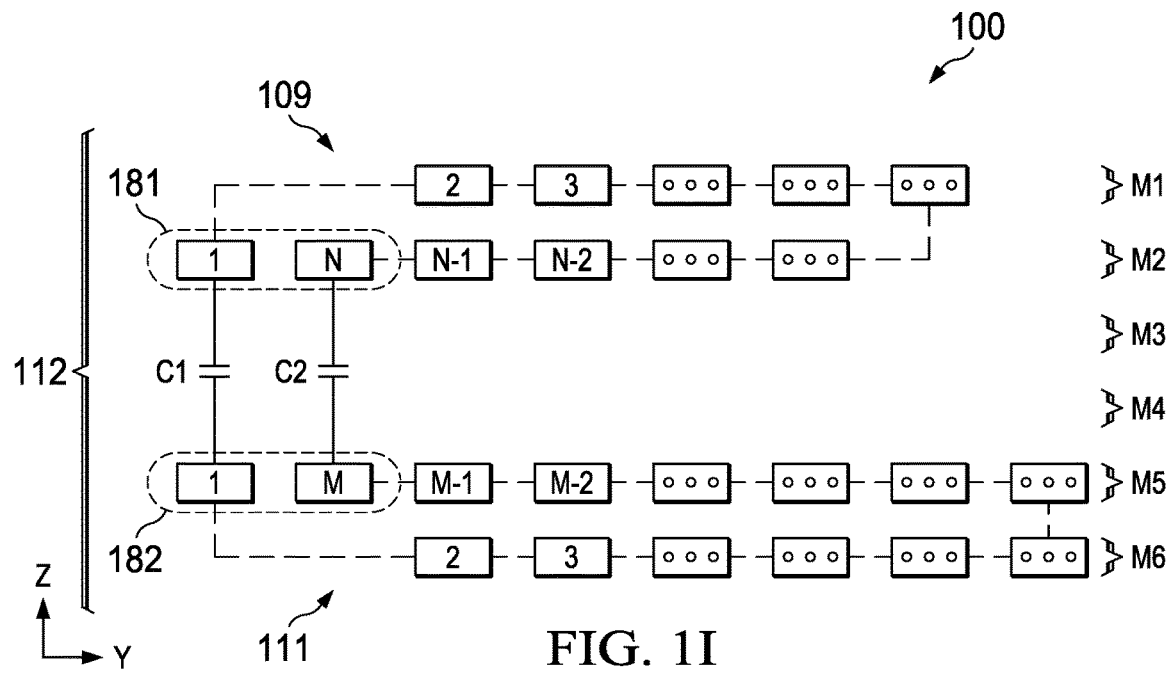
FIG. 1I is a partial sectional end elevation view of a general implementation of the magnetic assembly with schematically illustrated capacitors.
Figure 1J:
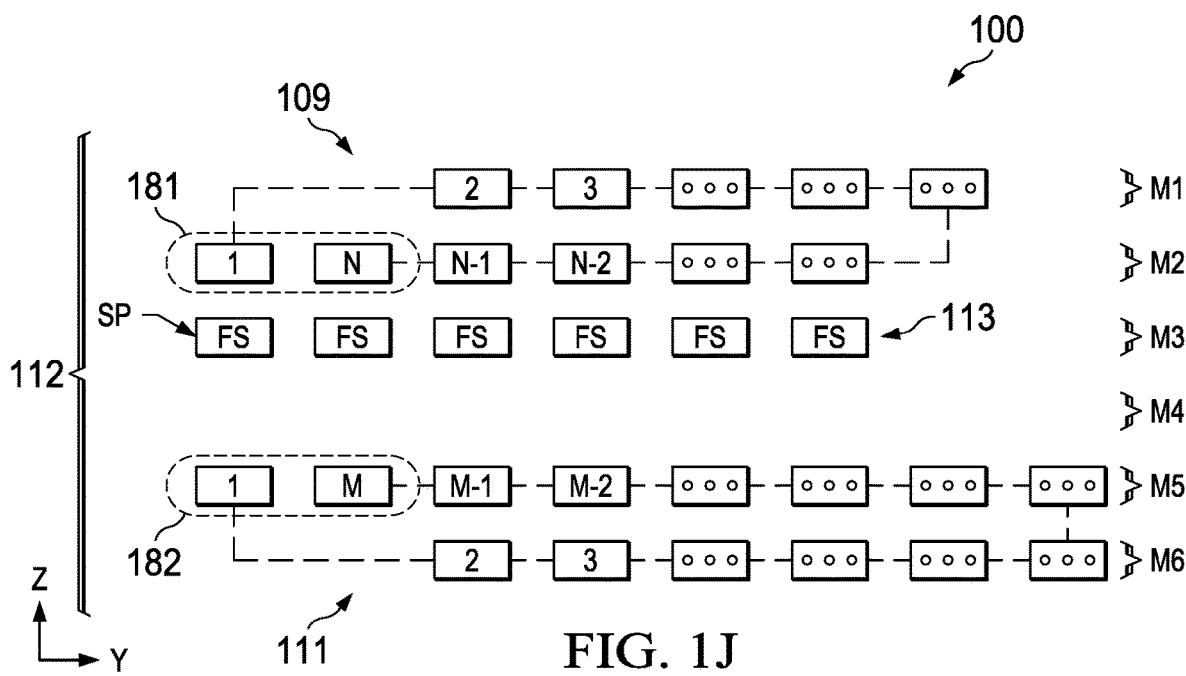
FIG. 1J is a partial sectional end elevation view of another general implementation of the magnetic assembly with primary shield windings.
Figure 1K:
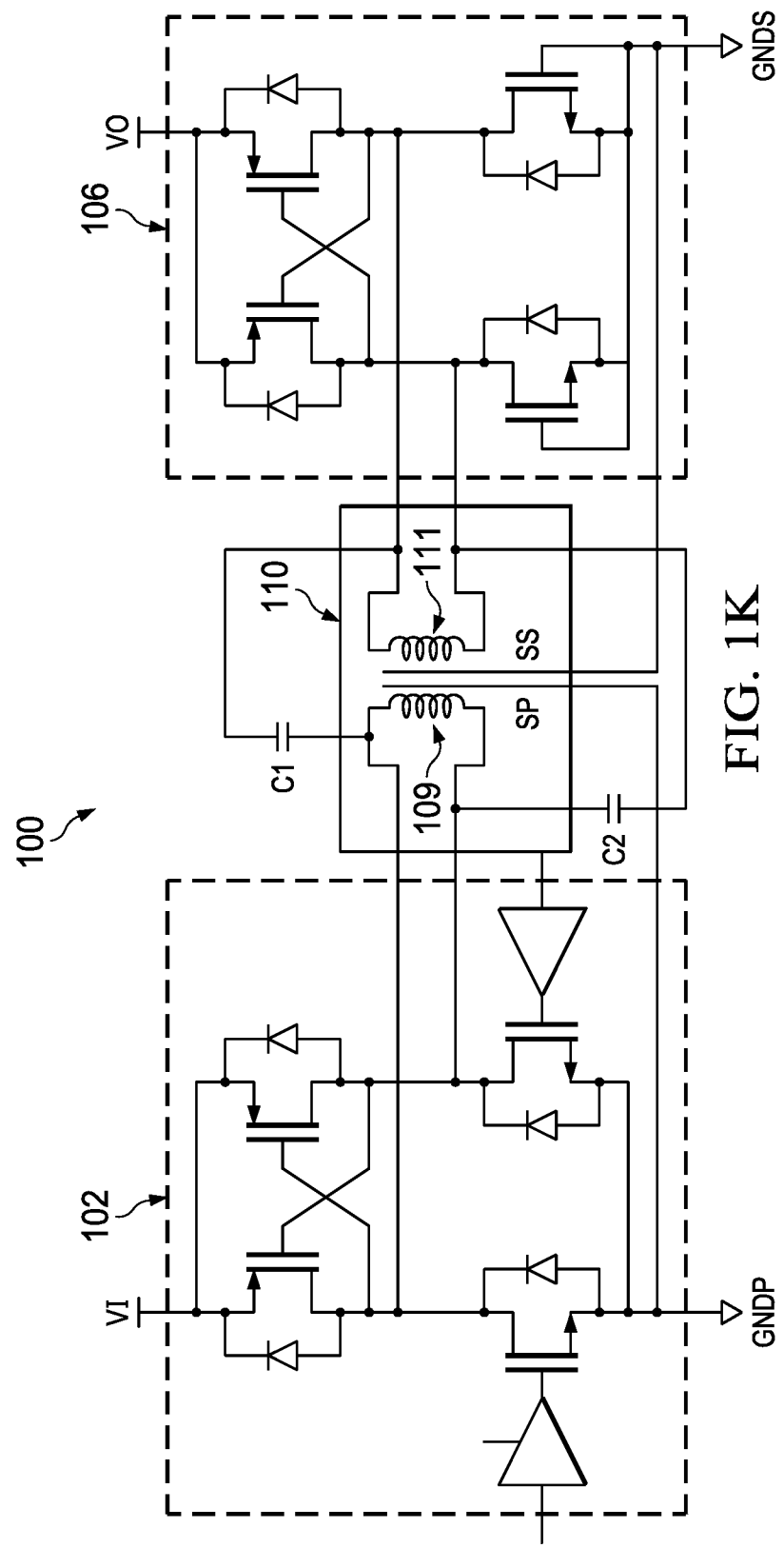
FIG. 1K is a schematic diagram of the packaged electronic device of FIG. 1.

Referring also to FIGS. 1I-1K, FIG. 1I shows a general implementation of the magnetic assembly 110 having no Faraday shield and schematically illustrated first and second interwinding capacitors or capacitances C1 and C2. In this general case, the first or primary winding includes an integer number N turns labeled 1, 2, 3 . . . , N−2, N−1 and N, with multiple ones of the turns in each of the first pair of metal layers M1 and M2. The first and final turns designated 1 and N are adjacent to one another and spaced apart from one another in the capital X-Y plane of the second metal layer M2, designated 181. In this general case, moreover, the secondary or second winding includes an integer number M winding turns labeled 1, 2, 3 . . . , M−2, M−1 and M with multiple ones of the turns in each of the second pair of metal layers M5 and M6. FIG. 1J shows another general implementation of the magnetic assembly with primary shield windings FS of the primary side Faraday shield SP, 113 and the third metal layer M3 as described above.

FIG. 1K shows a schematic diagram of the first and second circuits of the packaged electronic device 100. This example includes a primary side H bridge driver configuration of four transistors that receives an input voltage VI in the first semiconductor die 102, with joining nodes of the two sides of the H bridge circuit coupled to the ends of the primary side or first winding 109 of the magnetic assembly 110. In this example, the primary side faraday shield SP, 113 is schematically illustrated, and is electrically coupled to a primary side ground reference GNDP. The second circuit includes a secondary side H bridge output driver configuration of four additional transistors in the second semiconductor die 106. The second circuit includes internal joining nodes of the H bridge coupled to the ends of the second winding 111. The second circuit in this example provides a regulated output voltage VO. The schematic example of FIG. 1K also illustrates a secondary side faraday shield labeled SS coupled to a secondary side reference ground GNDS, an example of which is illustrated below in connection with another implementation in FIG. 20.

The coplanar and adjacent first and final turns of the primary and secondary windings in the implementations of FIGS. 1I and 1J, as well as the coplanar and adjacent first and final turns in the example of FIGS. 1-1B described above facilitate balancing of the inter-winding capacitance is C1 and C2 schematically shown in FIG. 1I. As seen in FIGS. 1I and 1K, the first inter-winding capacitor C1 extends between the upper ends of the respective primary and secondary windings 109 and 111. The second inter-winding capacitor C2 extends between the lower ends of the respective primary and secondary windings 109 and 111. In operation, the coplanar and adjacent positioning of the first and final turns of the primary and secondary windings advantageously balances the capacitances C1 and C2. The capacitance balancing provides an integrated EMI reduction solution that is easy to implement for a given transformer design by adjustment of the patterning of the metal layers of the multilevel lamination structure 112 and provides reliable and repeatable control of generated EMI of the packaged electronic device 100. Moreover, the integrated solution of these examples can be used alone or in combination with addition of external circuits, such as filter circuits, etc.

Referring also to FIGS. 2-18, FIG. 2 shows a method 200 of fabricating an electronic device and FIGS. 3-18 show the packaged electronic device 100 undergoing fabrication according to the method 200. The method 200 includes fabricating the magnetic assembly 110 at 201, 202, 204 and 206, including fabricating the multilevel lamination structure 112 at 201. In certain implementations, the multilevel lamination structure 112 of the magnetic assembly 110, or the magnetic assembly 110 itself is fabricated and provided as an input to a separate fabrication method used to produce a packaged electronic device 100.

The illustrated lamination structure fabrication at 201 constructs the example multilevel lamination structure 112 that includes the core layer 161, the dielectric layers 162-167, and the conductive features 111, 109, and 113 formed in the metal layers M1-M6 on or between respective ones or pairs of the dielectric layers 162-167, FIGS. 3-16 show one implementation of fabrication of the multilevel lamination structure at 201, including formation of successive layers or levels in each of the top and bottom sides of the starting dielectric core layer 161, each including a dielectric material layer 162-167 and patterned conductive metal features (e.g., copper, aluminum or alloys thereof) labeled as the six metal layers M1-M6 described above. The processing at 201 also includes forming conductive features and conductive inter-level vias (not shown) to interconnect patterned conductive features of different layers to one another. The conductive features 111, 109, and 113 in the illustrated example are formed in or on one or more of the six metal layers M1-M6 on or between respective ones or pairs of the dielectric layers 162-167 and/or the core layer 161.

As described above, the core layer 161 and the dielectric layers 162-165 extend in respective X-Y planes and are stacked along the third direction Z. The core layer 161 in one example provides an electrical isolation barrier between the first or primary circuit and the second or secondary circuit operating at an associated second voltage domain. The lamination structure 112 in one example is or includes build-up material formed by dry film lamination that begins as sheets that are pressed or otherwise installed onto a previous layer that may include patterned conductive features on a side thereof. The attached build-up material sheet fills gaps between the existing patterned conductive features and provides a dielectric layer with a generally planar side for formation of patterned conductive features of a new metal layer, formation of conductive vias through the attached layer and attachment of a subsequent layer. In one example, the lamination structure 110 and the constituent buildup material sheets are or include an organic material.

Figure 3:
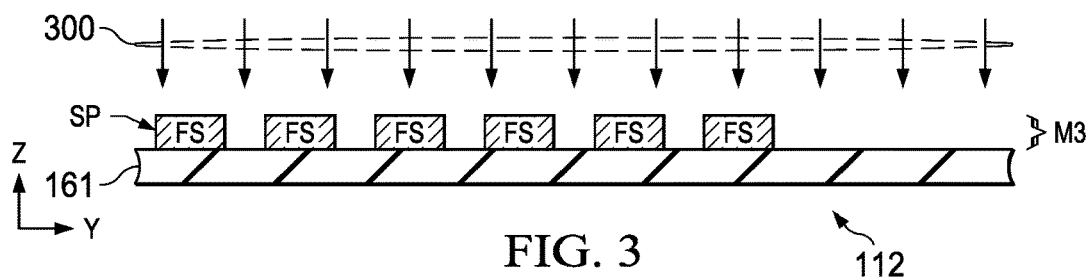
FIGS. 3-18 are partial sectional end elevation views of the packaged electronic device of FIG. 1 undergoing fabrication according to the method of FIG. 2.

In FIG. 3, a process 300 is performed that positions the core layer 161 as a sheet or strip on a carrier, such as an adhesive tape (not shown) for concurrent processing of multiple areas that individually correspond to a prospective multilevel lamination structure 112 which are subsequently separated, for example, by saw cutting, laser cutting or other suitable process. The processing 300 in one example includes forming one or more patterned conductive Faraday shield turn features FS of the metal layer M3 on the bottom side of the core layer 161 and/or formation of one or more conductive vias (not shown) through the core layer 161.

Figure 4:
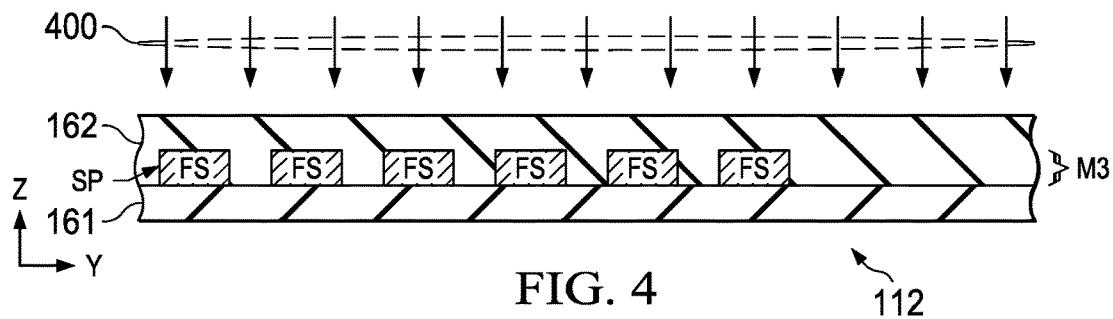
Figure 5:
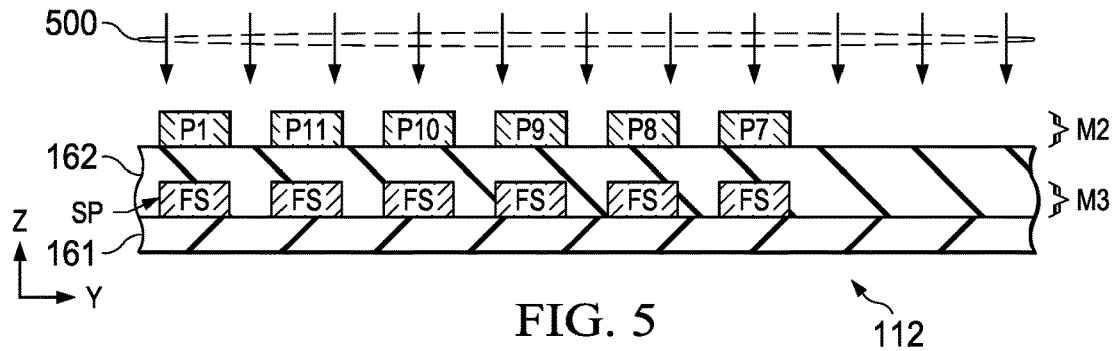
Figure 6:
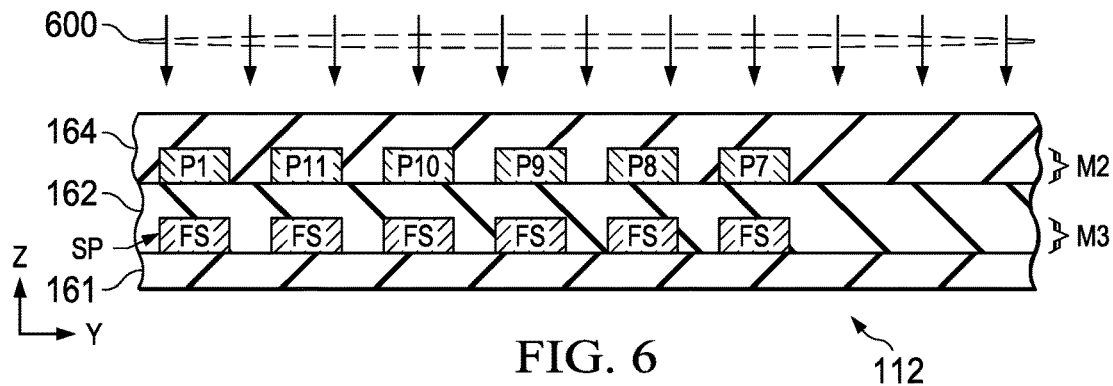
Figure 7:
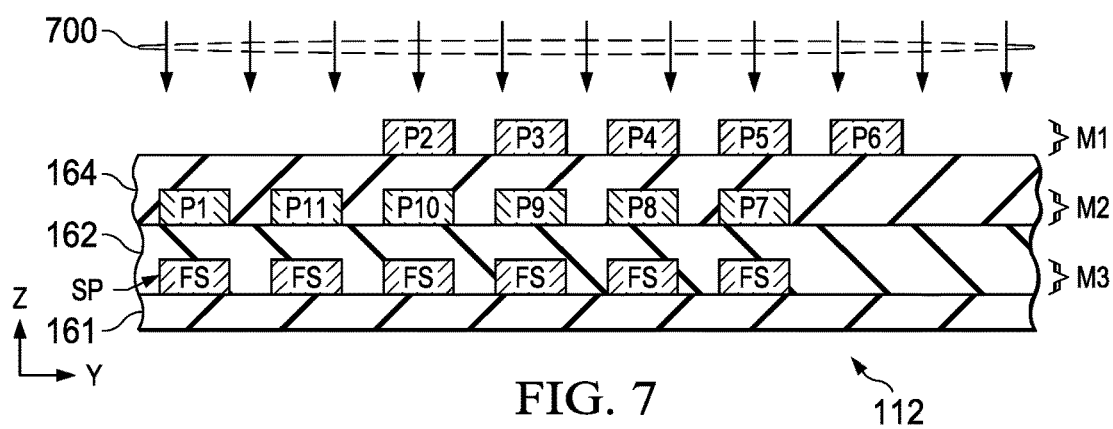
Figure 8:
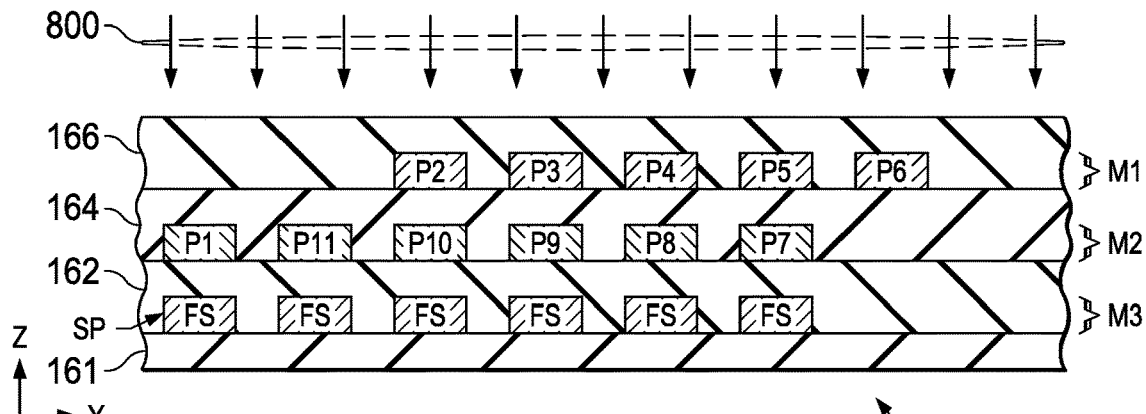

In FIG. 4, a first attachment process 400 is performed that attaches the dielectric layer 162 to the bottom side of the core layer 161, for example, by dry film lamination. In FIG. 5, a metallization process 500 is performed that forms the primary winding turns P1 and P7-P11 of the first patterned conductive feature 109 of the metal layer M2 on the bottom side of the dielectric layer 162, for example, by blanket deposition and pattern etching. The metallization process 500 and other metallization processes of the lamination structure fabrication include formation of any desired conductive via structures to extend through the previously attached dielectric layer. In FIG. 6, an attachment process 600 is performed that attaches the dielectric layer 164 to the bottom side of the dielectric layer 162, covering and filling gaps between the patterned conductive feature 109 of the metal layer M2. In FIG. 7, another metallization process 700 is performed that forms patterned conductive features including the primary winding turns P2-P6 of the first or bottom metal layer M1. In FIG. 8, another attachment process 800 is performed that attaches the dielectric layer 166 to the top side of the dielectric layer 164, covering and filling gaps between the patterned conductive features of the first metal layer M1.

Figure 9:
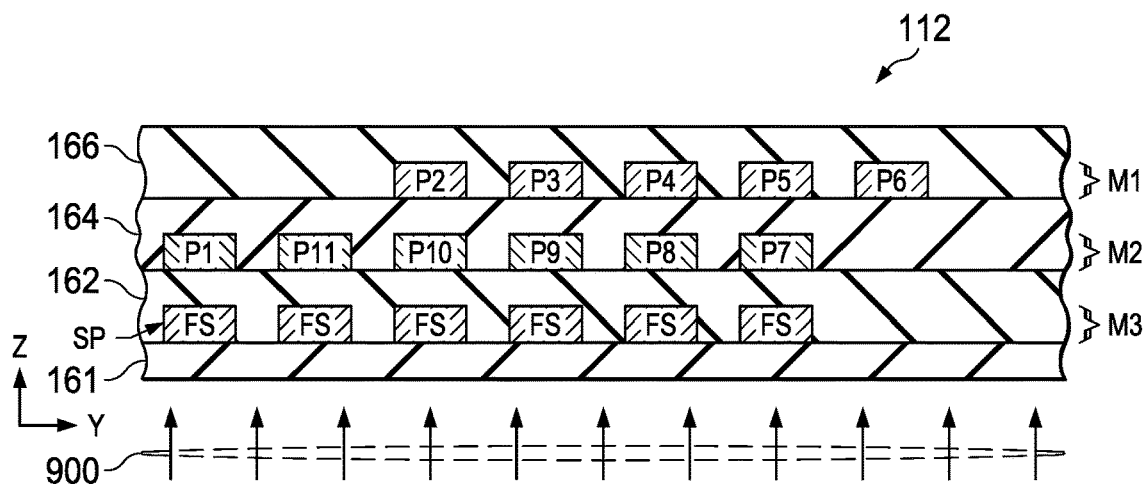
Figure 10:
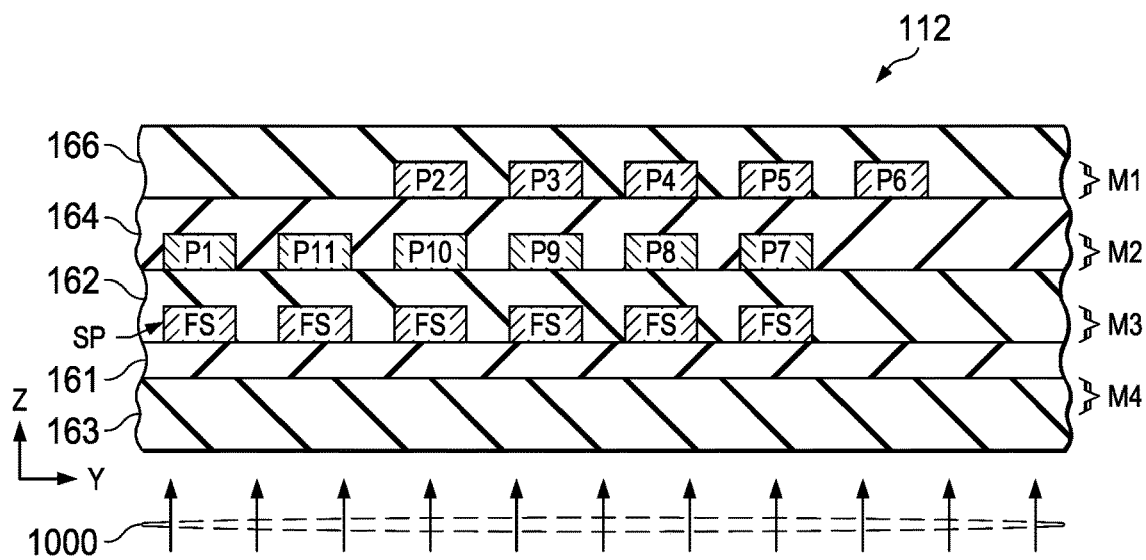
Figure 11:
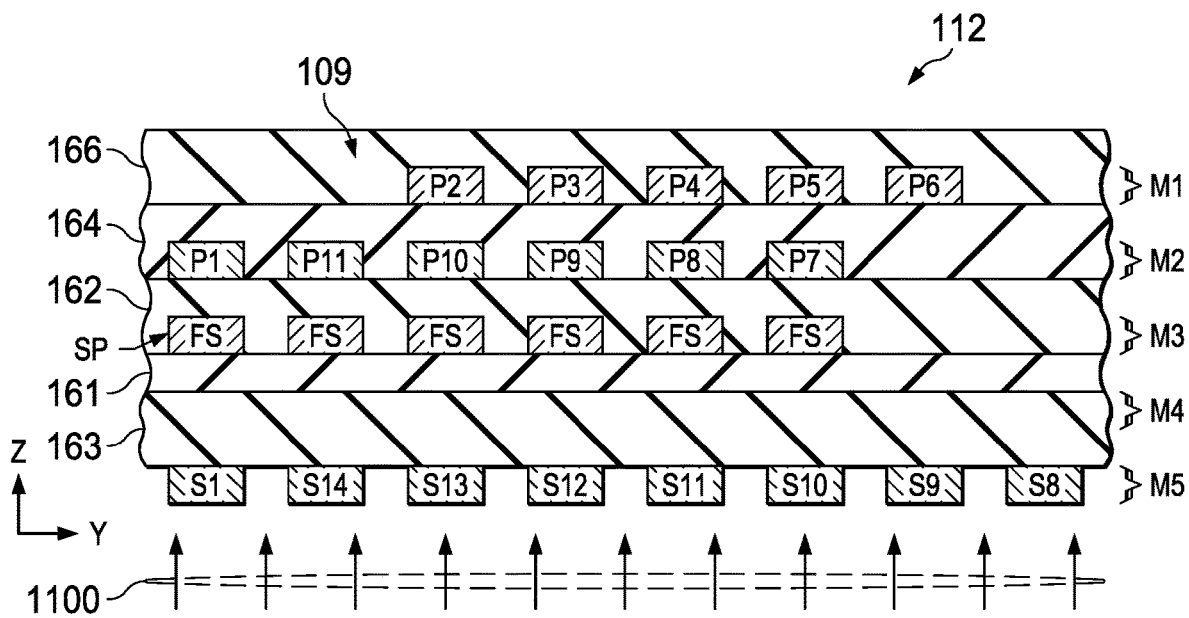
Figure 12:
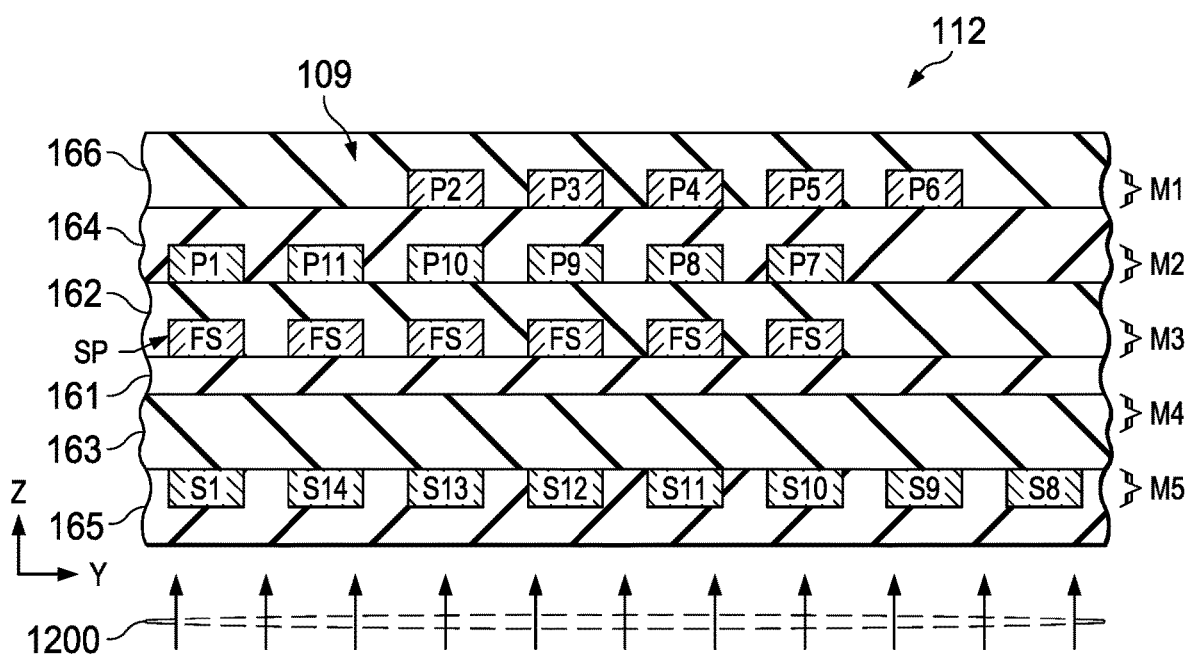
Figure 13:
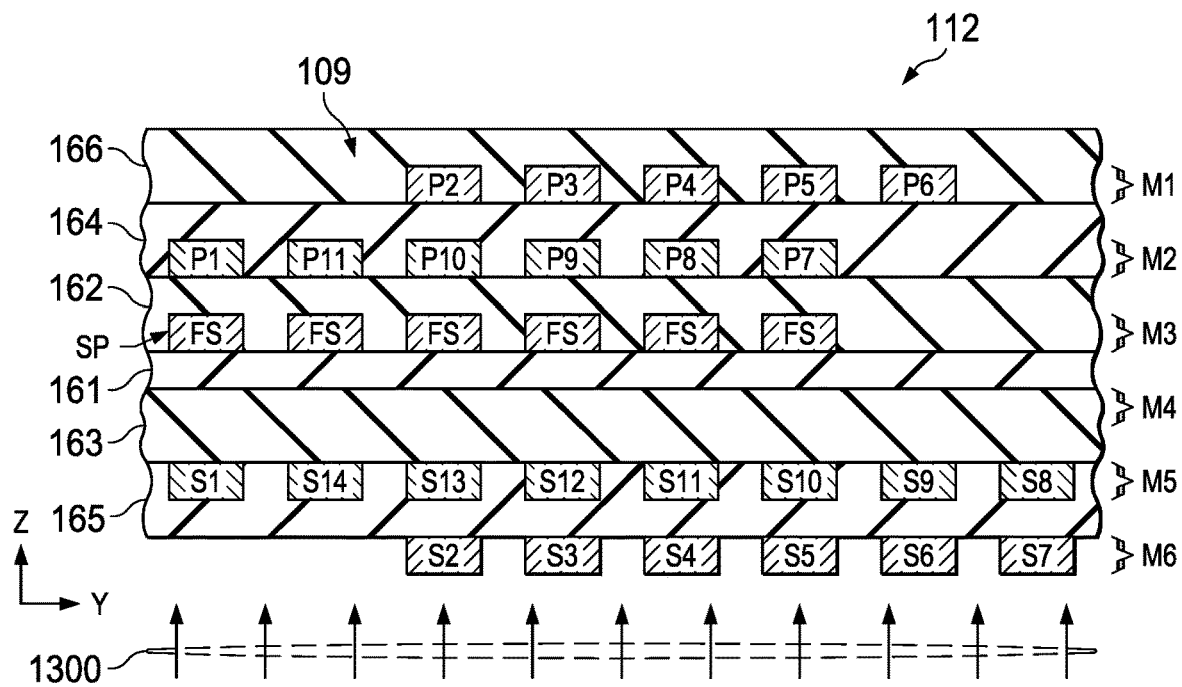
Figure 14:
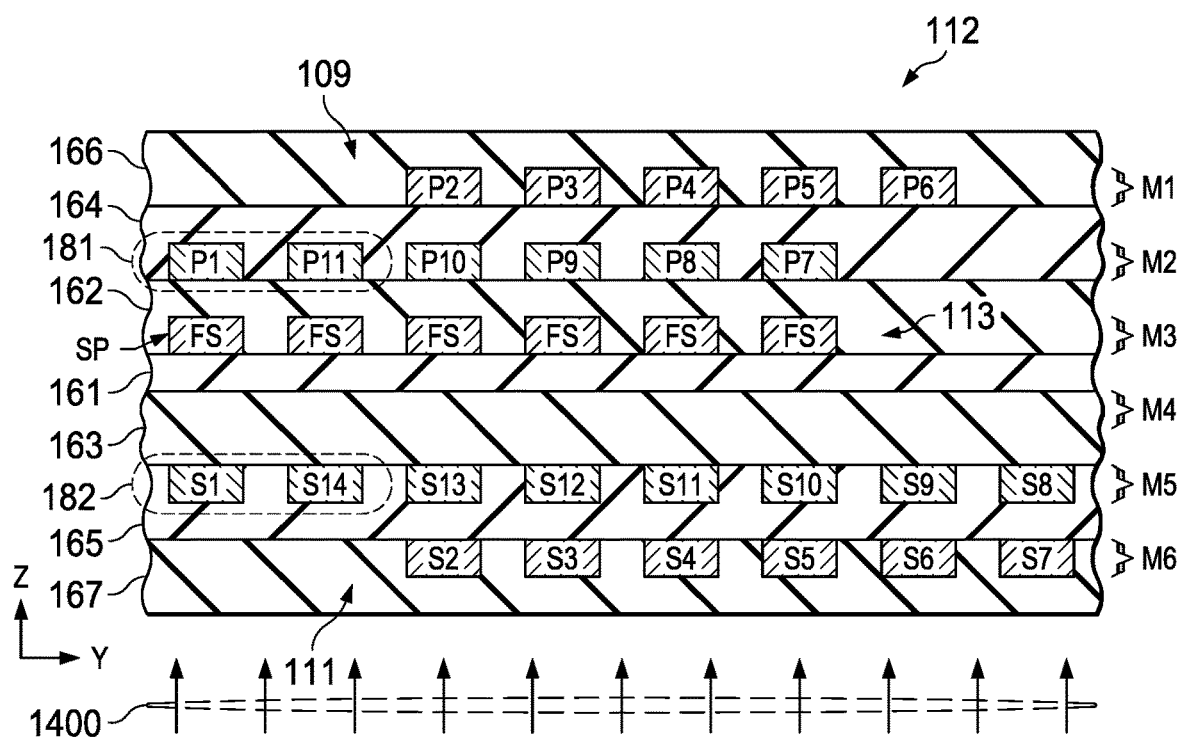

In FIG. 9, a metallization process 900 is performed that forms the patterned conductive features of the fourth metal layer M4 on the top side of the core layer 161 (not shown in the section view of FIG. 9, but the metal features are shown in the top view of FIG. 1F above). In FIG. 10, an attachment process 1000 is performed that attaches the dielectric layer 163 to the top side of the core layer 161, covering and filling gaps between the patterned conductive features of the fourth metal layer M4. In FIG. 11, a metallization process 1100 is performed that forms the patterned winding turns S1 and S8-S14 of the second patterned conductive feature of the fifth metal layer M5 on the top side of the dielectric layer 163. In FIG. 12, another attachment process 1200 is performed that attaches the dielectric layer 165 to the top side of the previous dielectric layer 163, covering and filling gaps between the patterned conductive features of the metal layer M5. In FIG. 13, a metallization process 1300 is performed that forms the patterned winding turns S2-S7 of the sixth metal layer M6 on the top side of the dielectric layer 165. In FIG. 14, another attachment process 1400 is performed that attaches the dielectric layer 167 to the top side of the previous dielectric layer 165, covering and filling gaps between the patterned conductive features of the metal layer M6.

In one example, the multilayer lamination structure fabrication at 201 includes formation of conductive metal features on the top and/or bottom side of the lamination structure 112 to allow bond wire connection to the transformer windings in the finished packaged electronic device 100 (e.g., FIG. 1). In one example, the multilayer lamination structure fabrication at 201 includes curing processing.

Figure 2:
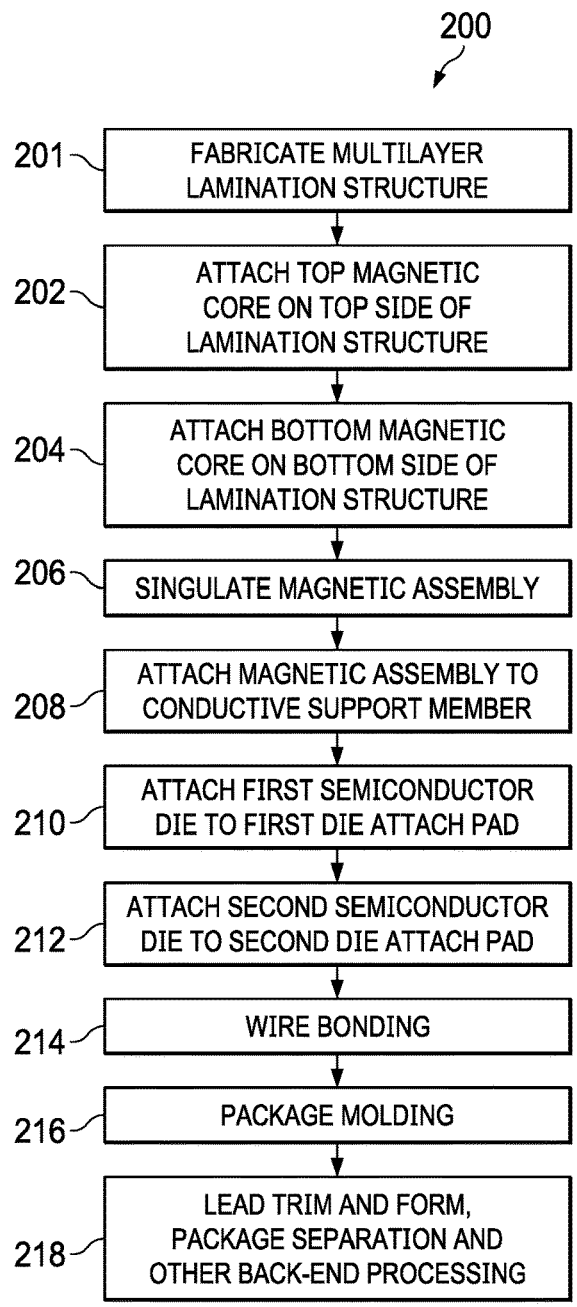
FIG. 2 is a flow diagram of a method of fabricating an electronic device.
Figure 15:
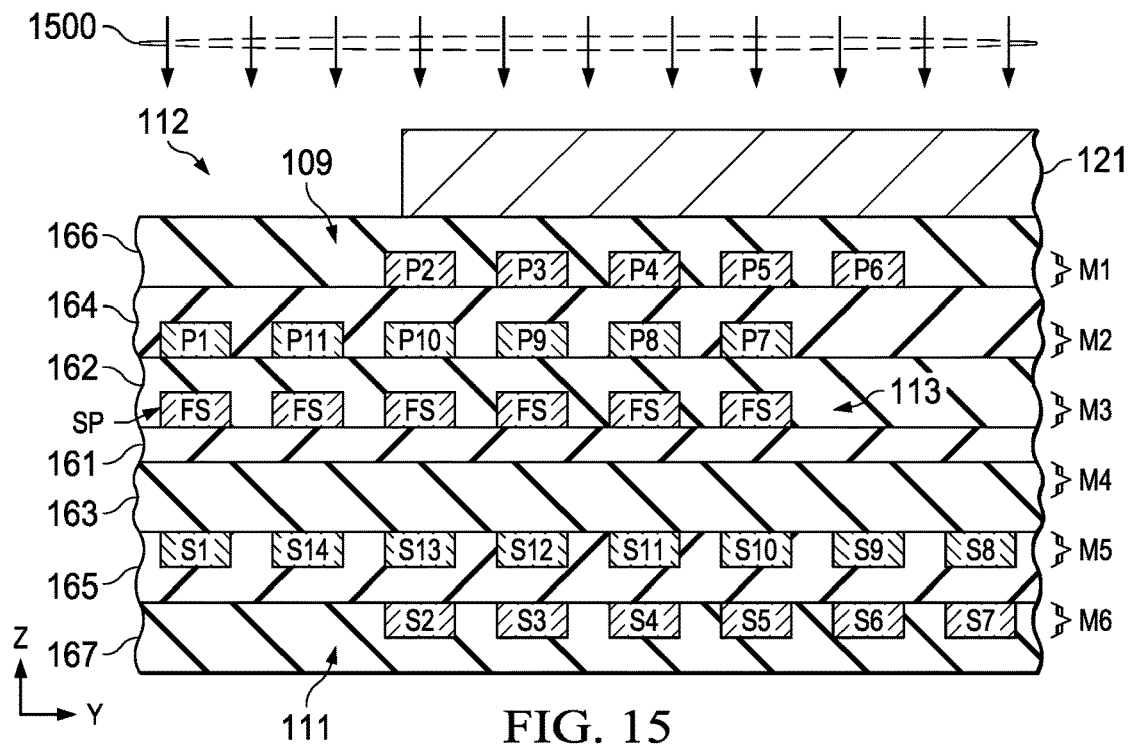
Figure 16:
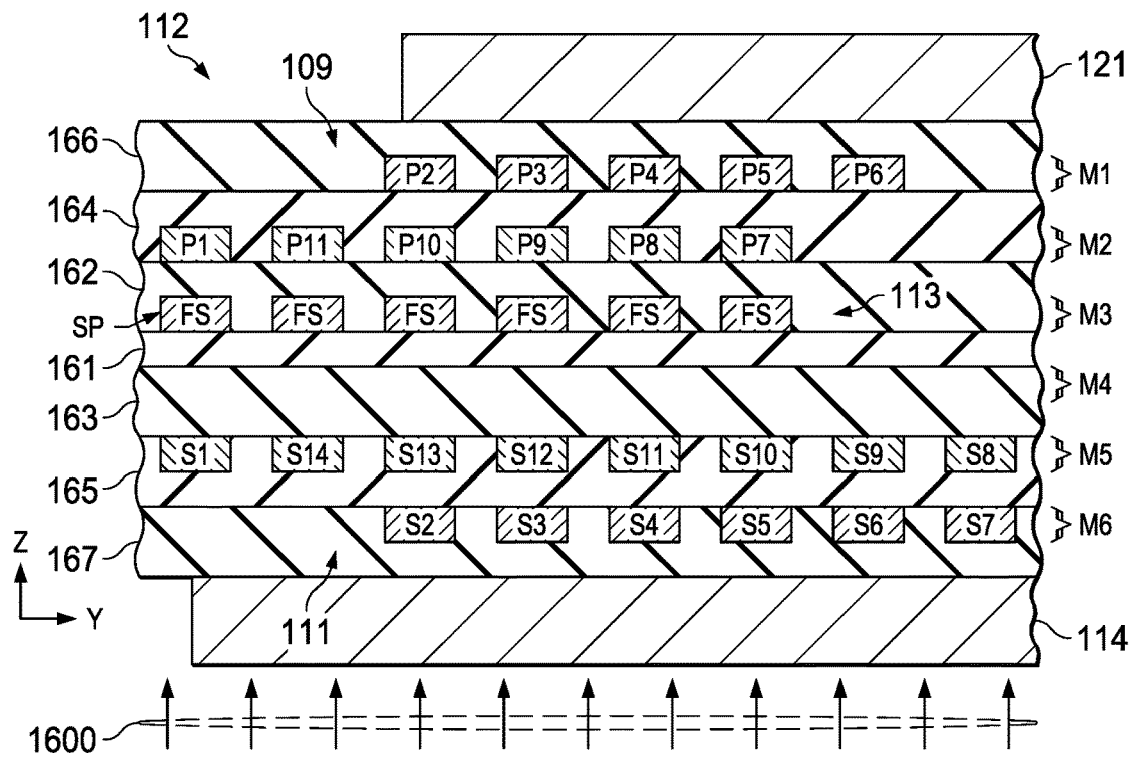

The method 200 continues at 202 in FIG. 2 with attaching the top magnetic core structure to the top side of the multilayer lamination structure 112. In FIG. 15, an attachment process 1500 is performed that attaches the magnetic core structure 121 to a portion of the bottom side of the dielectric layer 166, for example, using epoxy or another suitable adhesive (not shown). The magnetic core structure 121 in one example is a magnetic sheet structure, although not required of all possible implementations. The attachment process 1500 can include deposition of an epoxy or other adhesive onto the bottom surface of the multilevel lamination structure 112 and/or onto the surface of the core structure 121. The adhesive in one example is printed magnetic ink epoxy, although non-magnetic adhesives can be used in other examples. The attachment process 1500 also includes bringing the core structure 121 into contact with a portion of the bottom side of the multilevel lamination structure 112 and/or into contact with the epoxy formed thereon. The attachment process 1500 in one example also includes any necessary curing steps (e.g., thermal, optical, ultraviolet (UV), etc.). At 204 in FIG. 2, the method 200 continues with attachment of the magnetic core structure 114 to the opposite side of the multilayer lamination structure 112. In FIG. 16, another attachment process 1600 is performed that attaches the magnetic core structure 114 to a portion of the top side of the dielectric layer 167, for example, using epoxy or other adhesive (not shown) in an attachment process and like the process 1500 used to attach the magnetic core structure 121 as described above. In other examples, one or both magnetic core structures 121 and 114 can be omitted, with the remaining core structure or air providing magnetic coupling for the transformer of the device 100.

Figure 17:
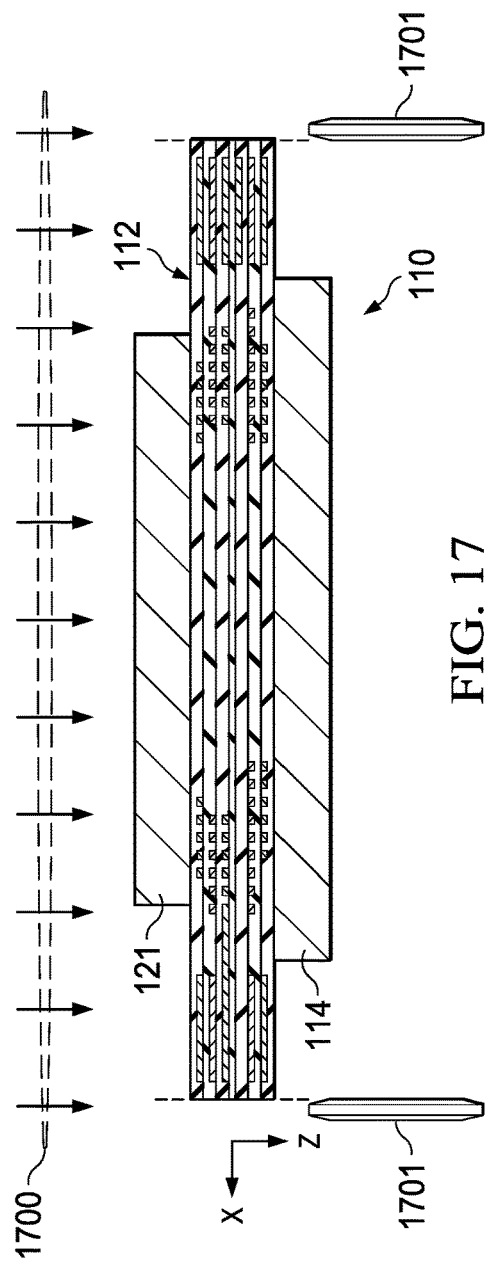

The method 200 in one example further includes separating (e.g., singulating) the magnetic assembly at 206. In the illustrated implementation, the magnetic assembly process is used to concurrently fabricate multiple laminated magnetic assemblies, such as using a single large multilevel lamination structure 112, and attachment of one or more core structures 114, 121 to opposite sides thereof. FIG. 17 shows one example, in which the lamination structure 112 is diced or cut by a process 1700 to singulate or separate individual laminated magnetic assemblies 110 (not shown) from the initial unitary structure, for example, using a saw blade 1701, etching, laser cutting, etc.

Figure 18:
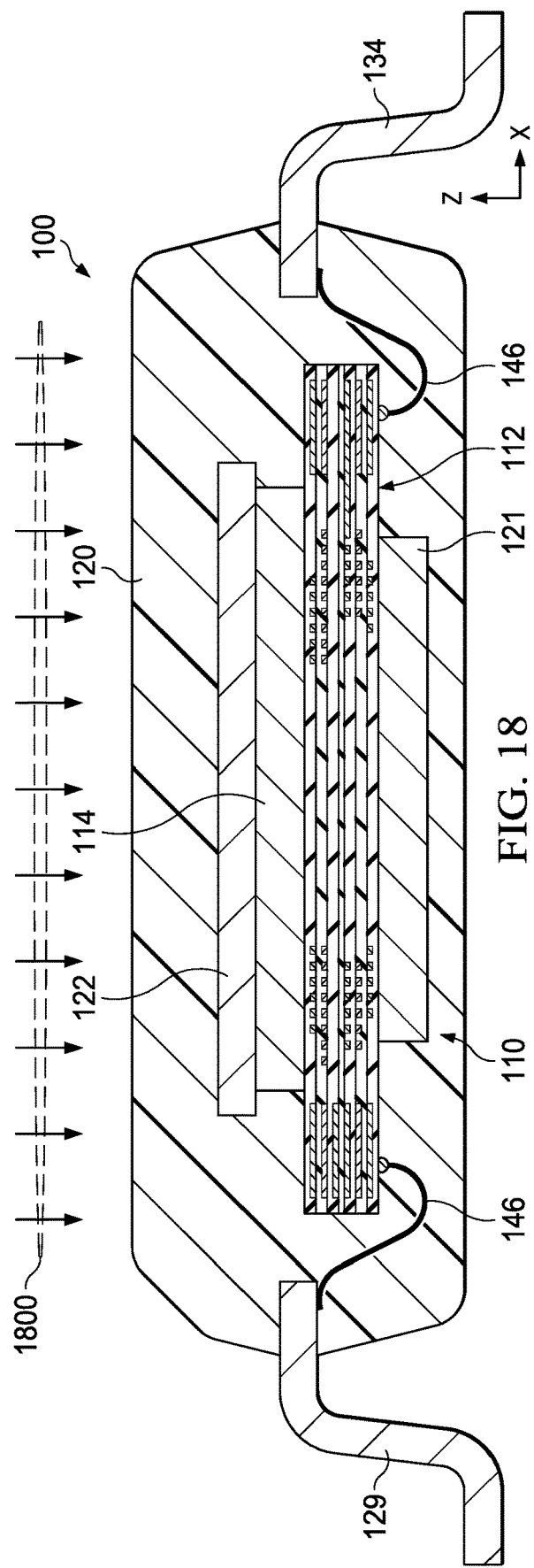

At 208 in FIG. 2, the magnetic assembly 110 is attached to the support structure 122 of a starting lead frame. FIG. 18 shows one example, with further processing 1800 that represents the further fabrication processing of the packaged electronic device 100. In one implementation, a starting lead frame is a panel with an array of frozen columns of prospective device areas processed concurrently, followed by subsequent device separation after package molding. In one example, a lead frame structure is provided that includes the support structure 122, conductive leads (e.g., 124-139 in FIG. 1) and conductive die attach pads 104 and 108. In one implementation, the lead frame structure is provided on a tacky tape or other adhesive carrier, with the various constituent structures assembled in a predetermined relative arrangement to facilitate subsequent assembly steps in the method 200. Any suitable attachment process can be used, such as application of adhesive, joining the components, and any necessary curing. In another example, conductive features of the multilevel lamination structure 112 can be soldered to the support structure 122 at 208.

The process 200 continues at 210 and 212 in FIG. 2 with attaching semiconductor dies to corresponding die attach pads, for example, using adhesive or soldering. The attachment process and 210 attaches the first semiconductor die 102 to the first die attach pad 104 (e.g., where the die attach pad 104 is one continuous conductive structure that includes the lead 125) in the orientation shown in FIG. 1 above. At 212, the processing also attaches the second semiconductor die 106 to the corresponding second die attach pad 108 (e.g., one continuous conductive structure that also includes the lead 138) as shown in FIG. 1.

The method 200 also includes wire bonding or other electrical connection processing at 214. FIG. 1 shows one example in which wire bond connections 146 are formed between the semiconductor dies 102, 106 and one or more conductive leads and/or exposed conductive features of the magnetic assembly 110 to form first and second circuits. In another example, different electrical connections are formed to create the first circuit, such as flip-chip processing to interconnect solder balls, conductive pillars, bond pads, etc. of the structures together in first and second electrical circuits. In certain examples, the wire bonding or other interconnection processing at 214 can be performed using supporting structures to provide mechanical structural support for one or more features of the magnetic assembly 110 during bond wire attachment. In one example, one or both magnetic core structures 114 and 121 can be supported with a custom bond wire clamping tool (not shown) during bond wire soldering operations. In one example, the bond wire clamping tool can include a cavity to support the laminate bond pad area that extends beyond the portions supported by the magnetic core structure or structures 114 and/01 21.

The method 200 continues at 216 with forming the final package structure 120. In one example, the packaging at 216 includes performing a molding process (not shown) that forms the package structure 120 to enclose the dies 102 and 106, the conductive die attach pads 104 and 108, the support structure 122, the magnetic assembly 110, the electrical connections (e.g., the bond wires 146) and portions of the conductive leads 124-139. At 218 in FIG. 2, lead trimming and forming operations are performed along with package separation and other back end processing to provide multiple finished packaged electronic device products, such as the device 100 shown in FIG. 1 above.

Figure 19:
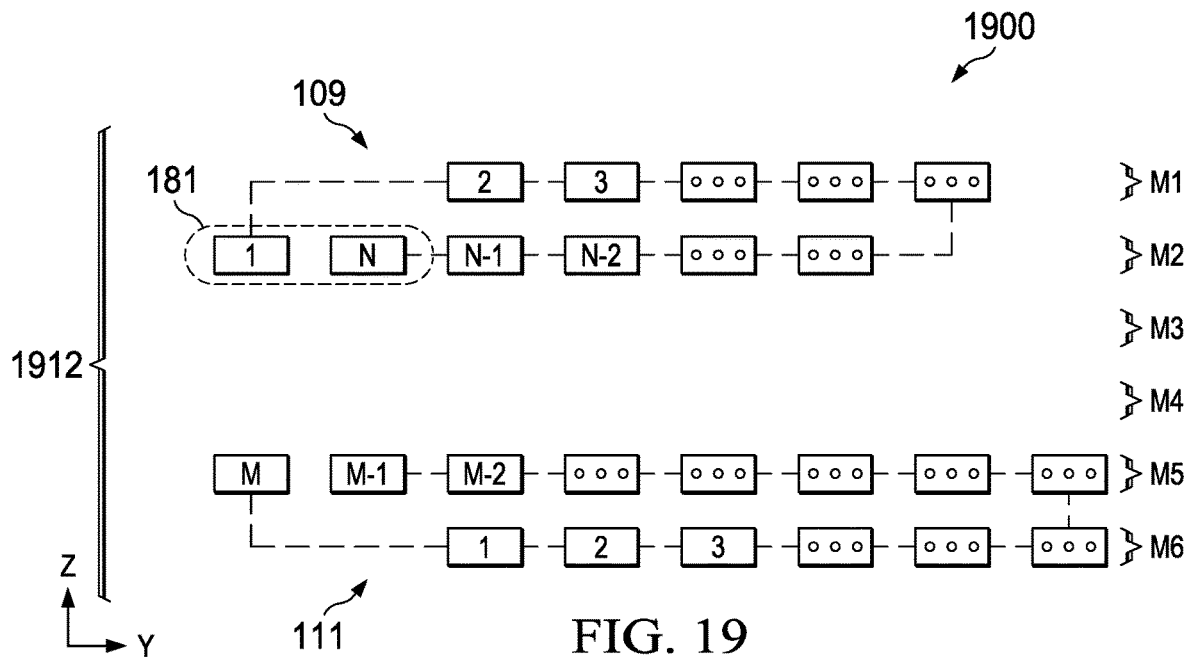
FIG. 19 is a simplified partial sectional end elevation view of another general implementation of the magnetic assembly with balanced primary windings.

FIG. 19 shows another general implementation of a multilayer lamination structure 1912 to provide a magnetic assembly 1900 with balanced primary windings (e.g., N turns labeled 1, 2, 3 . . . , N−2, N−1 and N) with the first and final turns 1 and N laterally spaced and adjacent to one another in the second metal layer M2. This example has no internal faraday shield structures, and the secondary winding turns (e.g., labeled 1, 2, 3 . . . , M−2, M−1 and M) are not balanced as in the example of FIGS. 1-1B above.

Figure 20:
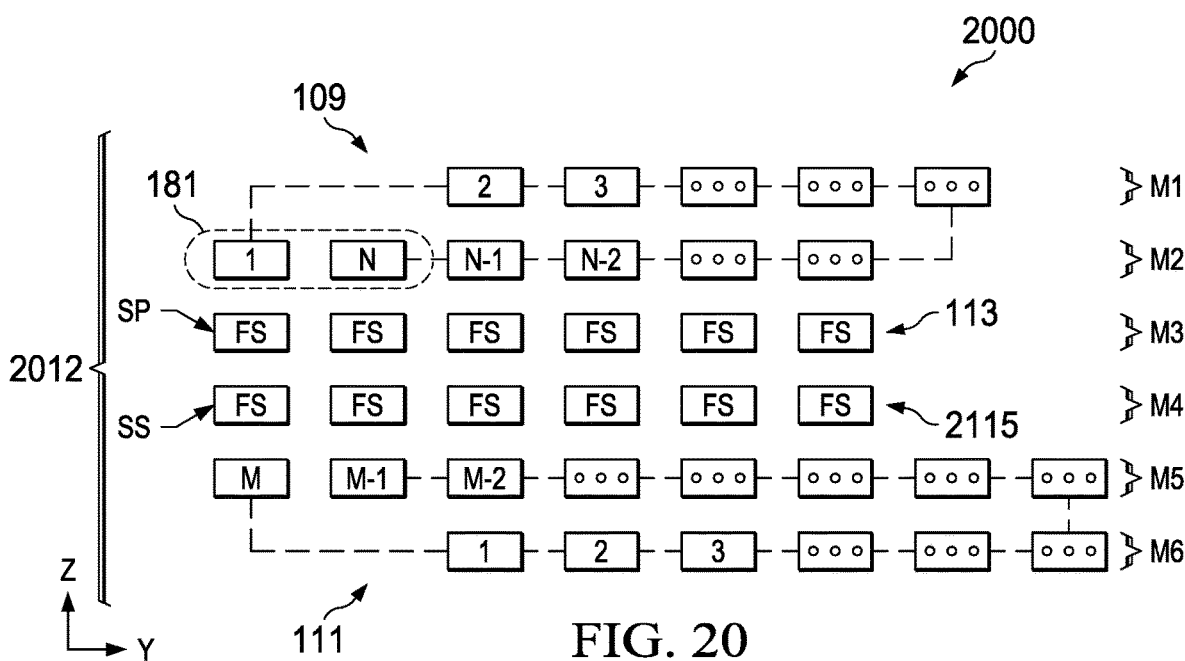
FIG. 20 is a simplified partial sectional end elevation view of another general implementation of the magnetic assembly with balanced primary windings, primary shield windings, and secondary shield windings.

FIG. 20 shows a further example magnetic assembly 2000 with a multilayer lamination structure 2012 having balanced primary windings (e.g., N turns labeled 1, 2, 3 . . . , N−2, N−1 and N) with the first and final turns 1 and N laterally spaced and adjacent to one another in the second metal layer M2, and the secondary winding turns (e.g., labeled 1, 2, 3 . . . , M−2, M−1 and M) are not balanced as in the example of FIGS. 1-1B above. In this example, a primary faraday shield SP 113 is provided in the third metal layer M3. The conductive features of the multilevel lamination structure 2012 in this example also including a second patterned shield SS, 2115 having multiple conductive turns in a second inner metal layer M4 to form a second shield SS. The second shield SS is positioned between the core layer 161 and the second pair of the metal layers M5, M6 along the third direction Z. In one implementation, the secondary side shield features 2115 (also labeled FS), are coupled to a secondary side reference voltage, such as the secondary ground reference GNDS in FIG. 1K above.

The illustrated examples and various implementations thereof provide a solution to reduce generated EMI in transformer-based circuits. The illustrated solutions are compatible with other transformer-related solutions such as Faraday shields, circuit-level solutions such as spread-spectrum modulation and PCB-level solutions such as EMI filters (e.g., ferrite beads or common-mode chokes) and the integrated EMI reduction solutions do not interfere or diminish the effectiveness of such additional external circuitry. The illustrated examples provide symmetrical transformer designs with improved coil symmetry, without requiring the use of FIG. 8 coil designs and the associated increase in device size. Moreover, the illustrated solutions can be used alone without requiring external circuitry, while facilitating improved EMI performance.

Modifications are possible in the described examples, and other implementations are possible, within the scope of the claims.

What is claimed is:

1. An electronic device, comprising:
   a multilevel lamination structure having a core layer, dielectric layers and conductive features formed in metal layers on or between respective ones or pairs of the dielectric layers, the core layer and the dielectric layers extending in respective planes of orthogonal first and second directions and stacked along a third direction that is orthogonal to the first and second directions, the conductive features including:
      a first patterned conductive feature having multiple conductive turns in each of a first pair of the metal layers to form a first winding having a first turn and a final turn, the first and final turns of the first winding spaced apart from one another and adjacent to one another in the same metal layer of the first pair; and
      a second patterned conductive feature having multiple conductive turns in each of a second pair of the metal layers to form a second winding having a first turn and a final turn, the core layer positioned between the first and second patterned conductive features along the third direction;
   a semiconductor die electrically coupled to the multilevel lamination structure; and
   a package structure that encloses the multilevel lamination structure and the semiconductor die.

2. The electronic device of claim 1, wherein the first and final turns of the second winding are spaced apart from one another and adjacent to one another in the same metal layer of the second pair.

3. The electronic device of claim 2, wherein:
   the first turn of the first winding is at least partially aligned with the first turn of the second winding along the third direction; and
   the final turn of the first winding is at least partially aligned with the final turn of the second winding along the third direction.

4. The electronic device of claim 3, the conductive features of the multilevel lamination structure further including a patterned shield having multiple conductive turns in an inner metal layer to form a shield, the shield positioned between the core layer and the first pair along the third direction.

5. The electronic device of claim 4, the conductive features of the multilevel lamination structure further including a second patterned shield having multiple conductive turns in a second inner metal layer to form a second shield, the second shield positioned between the core layer and the second pair along the third direction.

6. The electronic device of claim 2, the conductive features of the multilevel lamination structure further including a patterned shield having multiple conductive turns in an inner metal layer to form a shield, the shield positioned between the core layer and the first pair along the third direction.

7. The electronic device of claim 1, wherein:
   the first turn of the first winding is at least partially aligned with the first turn of the second winding along the third direction; and
   the final turn of the first winding is at least partially aligned with the final turn of the second winding along the third direction.

8. The electronic device of claim 7, the conductive features of the multilevel lamination structure further including a patterned shield having multiple conductive turns in an inner metal layer to form a shield, the shield positioned between the core layer and the first pair along the third direction.

9. The electronic device of claim 8, the conductive features of the multilevel lamination structure further including a second patterned shield having multiple conductive turns in a second inner metal layer to form a second shield, the second shield positioned between the core layer and the second pair along the third direction.

10. The electronic device of claim 1, the conductive features of the multilevel lamination structure further including a patterned shield having multiple conductive turns in an inner metal layer to form a shield, the shield positioned between the core layer and the first pair along the third direction.

11. The electronic device of claim 1, further comprising a magnetic core structure attached to a side of the multilevel lamination structure.

12. A magnetic assembly, comprising:
    a core layer;
    dielectric layers; and
    conductive features formed in metal layers on or between respective ones or pairs of the dielectric layers, the core layer and the dielectric layers extending in respective planes of orthogonal first and second directions and stacked along a third direction that is orthogonal to the first and second directions, the conductive features including:
       a first patterned conductive feature having multiple conductive turns in each of a first pair of the metal layers to form a first winding having a first turn and a final turn, the first and final turns of the first winding spaced apart from one another and adjacent to one another in the same metal layer of the first pair; and
       a second patterned conductive feature having multiple conductive turns in each of a second pair of the metal layers to form a second winding having a first turn and a final turn, the core layer positioned between the first and second patterned conductive features along the third direction.

13. The magnetic assembly of claim 12, further comprising a magnetic core structure attached to a side of the multilevel lamination structure.

14. The magnetic assembly of claim 12, wherein the first and final turns of the second winding are spaced apart from one another and adjacent to one another in the same metal layer of the second pair.

15. The magnetic assembly of claim 14, wherein:
    the first turn of the first winding is at least partially aligned with the first turn of the second winding along the third direction; and
    the final turn of the first winding is at least partially aligned with the final turn of the second winding along the third direction.

16. The magnetic assembly of claim 14, the conductive features of the multilevel lamination structure further including a patterned shield having multiple conductive turns in an inner metal layer to form a shield, the shield positioned between the core layer and the first pair along the third direction.

17. The magnetic assembly of claim 12, wherein:
the first turn of the first winding is at least partially aligned with the first turn of the second winding along the third direction; and
the final turn of the first winding is at least partially aligned with the final turn of the second winding along the third direction.

18. The magnetic assembly of claim 12, the conductive features of the multilevel lamination structure further including a patterned shield having multiple conductive turns in an inner metal layer to form a shield, the shield positioned between the core layer and the first pair along the third direction.

19. A method for fabricating an electronic device, the method comprising:
fabricating a multilevel lamination structure including: a core layer; dielectric layers; and conductive features formed in metal layers on or between respective ones or pairs of the dielectric layers, the core layer and the dielectric layers extending in respective planes of orthogonal first and second directions and stacked along a third direction that is orthogonal to the first and second directions, the conductive features including: a first patterned conductive feature having multiple conductive turns in each of a first pair of the metal layers to form a first winding having a first turn and a final turn, the first and final turns of the first winding spaced apart from one another and adjacent to one another in the same metal layer of the first pair; and a second patterned conductive feature having multiple conductive turns in each of a second pair of the metal layers to form a second winding having a first turn and a final turn, the core layer positioned between the first and second patterned conductive features along the third direction;
coupling a semiconductor die to one of the first and second windings; and
enclosing the multilevel lamination structure and the semiconductor die in a package structure.

20. The method of claim 19, further comprising attaching a magnetic core structure to a side of the multilevel lamination structure.

* * * * *